(12) United States Patent
Hirakata et al.

(10) Patent No.: US 6,465,268 B2
(45) Date of Patent: Oct. 15, 2002

(54) METHOD OF MANUFACTURING AN ELECTRO-OPTICAL DEVICE

(75) Inventors: Yoshiharu Hirakata, Kanagawa-ken (JP); Takeshi Nishi, Kanagawa-ken (JP); Shunpei Yamazaki, Kanagawa-ken (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/793,116

(22) Filed: Feb. 27, 2001

(65) Prior Publication Data

US 2001/0051398 A1 Dec. 13, 2001

Related U.S. Application Data

(62) Division of application No. 09/083,041, filed on May 22, 1998, now abandoned.

(30) Foreign Application Priority Data

| May 22, 1997 | (JP) | 9-148540 |
| May 26, 1997 | (JP) | 9-152805 |
| Jun. 9, 1997 | (JP) | 9-167990 |
| Jun. 23, 1997 | (JP) | 9-183024 |

(51) Int. Cl.[7] .................. H01L 21/00; G02F 1/1339
(52) U.S. Cl. ............................. 438/30; 349/155
(58) Field of Search ....................... 438/29, 30, 34, 438/128, 692; 349/155, 187, 191, 192

(56) References Cited

U.S. PATENT DOCUMENTS

| 4,874,461 A | | 10/1989 | Sato et al. |
| 5,379,139 A | | 1/1995 | Sato et al. |
| 5,499,128 A | * | 3/1996 | Hasegawa et al. |
| 5,691,793 A | * | 11/1997 | Watanabe et al. |
| 5,831,710 A | * | 11/1998 | Colgan et al. |
| 5,978,063 A | * | 11/1999 | Crawford et al. |
| 6,236,445 B1 | * | 5/2001 | Foschaar et al. |

FOREIGN PATENT DOCUMENTS

| JP | 61-184518 | | 8/1986 |
| JP | 63-050817 | A | 3/1988 |
| JP | 5-281558 | | 10/1993 |
| JP | 5-281558 | A | 10/1993 |
| JP | 6-244104 | A | 9/1994 |
| JP | 6-265912 | A | 9/1994 |
| JP | 8-248427 | A | 9/1996 |
| JP | 8-248427 | | 9/1996 |
| JP | 9-73093 | | 3/1997 |
| JP | 9-73093 | A | 3/1997 |
| JP | 9-197413 | | 7/1997 |
| JP | 10-68955 | | 3/1998 |
| JP | 10-68955 | A | 3/1998 |

* cited by examiner

*Primary Examiner*—Keith Christianson
(74) *Attorney, Agent, or Firm*—Eric J. Robinson; Robinson Intellectual Property Law Office PC

(57) ABSTRACT

In an active matrix semiconductor display device in which pixel TFTs and driver circuit TFT are formed on the same substrate in an integral manner, the cell gap is controlled by gap retaining members that are disposed between a pixel area and driver circuit areas. This makes it possible to provide a uniform cell thickness profile over the entire semiconductor display device. Further, since conventional grainy spacers are not used, stress is not imposed on the driver circuit TFTs when a TFT substrate and an opposed substrate are bonded together. This prevents the driver circuit TFTs from being damaged.

15 Claims, 30 Drawing Sheets

314

314

RUBBING STEP

SEALING MATERIAL PRINTING AND SPACER SCATTERING STEPS

BONDING STEP

METHOD OF MANUFACTURING AN ELECTRO-OPTICAL DEVICE

BACKGROUND OF THE INVENTION

1. Field of the Invention

The present invention relates to a semiconductor display device using thin-film transistors. In particular, the invention relates to a semiconductor display device in which a pixel switching circuit and driver circuits are formed on the same substrate in an integral manner.

2. Description of the Related Art

In recent years, the techniques of forming semiconductor devices, such as thin-film transistors (TFTs), by using a semiconductor thin film formed on an inexpensive glass substrate have made rapid progress. This is because of increased demand for active matrix liquid crystal display devices.

In active matrix liquid crystal display devices, TFTs are provided for respective ones of hundreds of thousands to millions of pixel regions that are arranged in matrix and charge that enters or exits from each pixel electrode is controlled by the switching function of the associated TFT.

The basic configuration of an active matrix liquid crystal display device in which thin-film transistors are arranged will be described below with reference to FIGS. 34A and 34B. FIG. 34A is a sectional view obtained by cutting a liquid crystal display device by a plane perpendicular to a substrate, specifically taken along a chain line A–A' in FIG. 34B.

An insulating film (not shown) is formed on the surface of a transparent base substrate 1. Reference numeral 2 denotes an active layer of a TFT; 3, a gate electrode; 4, a data line; 5, a drain electrode; 6, an interlayer insulating film; 7, a black matrix; 8, a transparent conductive film as a pixel electrode; and 9, an alignment film.

In this specification, the structure including the base substrate 1 and the other members mentioned above (including the TFTs) is called an "TFT substrate." Although FIG. 34A focuses on a single pixel, actually the TFT substrate is composed of a pixel area including hundreds of thousands to millions of pixel switching TFTs (called pixel TFTs) and peripheral driver circuit areas including a number of TFTs for driving the pixel TFTs.

On the other hand, reference numerals 10–12 denote a transparent substrate, a transparent conductive film as an opposed electrode, and an alignment film, respectively. The structure including these members, which is opposed to the TFT substrate, is called an "opposed substrate."

As shown in FIG. 35A, the TFT substrate 20 and the opposed substrate 30 are subjected to an alignment treatment such as rubbing for giving proper alignment to a liquid crystal. Thereafter, to control a substrate interval (cell gap) between the TFT substrate 20 and the opposed substrate 30, grainy spacers 41 are uniformly scattered over the entire surface of the TFT substrate 20. Then, a sealing agent 42 is printed. The sealing agent 42 has a role of an adhesive for bonding the substrates 20 and 30 together as well as a role of a sealing material for sealing the space between the substrates 20 and 30 to prevent a liquid crystal material that will be injected there from leaking to the outside of the substrates.

FIG. 36 is a sectional view of the TFT substrate 20. Since the grainy spacers 41 are uniformly scattered over the entire surface of the TFT substrate 20 to control the cell gap, the spacers 41 exist in not only the pixel area 22 but also the peripheral driver circuit regions 23 as shown in FIG. 36. Usually, the pixel TFTs formed in the pixel area 22 are not much different in device size from the driver circuit TFTs formed in the driver circuit areas 23. However, the black matrix for covering the pixel TFTs, the pixel electrodes that are transparent conductive films, and other members are formed in the pixel area 22. Further, in reflection-type liquid crystal display devices, a reflective electrode is formed in the pixel area 22. On the other hand, connection lines necessary to constitute CMOS circuits for driving the pixel TFTs are formed in the driver circuit areas 23. Therefore, there are differences in the height (distance) from the surface of the base substrate 1 between the pixel area 22 and the driver circuit areas 23.

A description will now be made of a case where the height as measured from the surface of the substrate 1 in the pixel area 11 is greater than in the driver circuit areas 23. The grainy spacers 41 are scattered in not only the pixel area 22 but also the driver circuit areas 23 by a wet or dry method. If the grainy spacers 41 have approximately uniform sizes, they have differences in the height as measured from the substrate 1 depending on their positions. Now, the height of the top of each spacer 41 in the pixel area 22 and that of the top of each spacer 41 in the driver circuit areas 23 are represented by hp and hd, respectively. As seen from FIG. 36, a height difference $\Delta h = hp - hd$ occurs due to the difference in height between the pixel area 22 and the driver circuit areas 23.

Then, as shown in FIG. 37A, the TFT substrate 20 and the opposed substrate 30 are bonded together with the sealing agent 42. Thereafter, the space between the TFT substrate 20 and the opposed substrate 30 are filled with a liquid crystal material 43 and a liquid crystal injection inlet 44 is sealed with a sealing material (see FIG. 37B). In this manner, an active matrix liquid crystal display device having the configuration shown in FIG. 34A is obtained.

However, the liquid crystal display device having the above configuration has the following problems.

Because of the height difference $\Delta h$ that is caused by the difference in height between the pixel area 22 and the driver circuit areas 23, the cell gas cannot be made uniform, that is, a cell thickness variation occurs, when the TFT substrate 20 and the opposed substrate are bonded together. Further, as shown in FIGS. 37A and 37B, strain occurs in the opposed substrate 30. Defects such as display unevenness and an interference fringe (on the top surface of the opposed substrate) may occur in a liquid crystal display device having a cell thickness variation and strain in the opposed substrate 30.

Where the height as measured from the substrate 1 in the driver circuit areas 23 is greater than in the pixel area 22, because of the above-described height difference $\Delta h$, unduly strong force is exerted on the spacers 41 that are scattered in the driver circuit areas 23 when the TFT substrate 20 and the opposed substrate 30 are bonded together. As a result, the driver circuit TFTs having a more complex structure than the pixel TFTs are damaged considerably, which adversely affects the yield of products.

Where grainy spacers 15 exist in the pixel area, disorder in image display (disclination) may be observed as shown in FIG. 34B because the alignment of the liquid crystal material is disordered in the vicinity of the spacers 15.

As described above, where the cell gap is controlled by using conventional grainy spacers, satisfactory display may not be obtained due to various factors.

In liquid crystal display devices that are commonly manufactured or manufactured as trial products, the cell gap appears to be set at 4–6 μm irrespective of the pixel pitch. However, in the future, liquid crystal panels will be required to have higher resolution and hence the pixel pitch will be increasingly reduced.

For example, projection-type liquid crystal display devices are desired to be able to display images having as high resolution as possible in view of the fact that the images are projected onto a screen in an enlarged manner. Also from the viewpoint of the cost, the optical system needs to be miniaturized and the panel size needs to be reduced. For the above reasons, in the future, it will be necessary to manufacture liquid crystal display devices having a pixel pitch of 40 μm or less, preferably 30 μm or less.

In liquid crystal display devices for displaying such high resolution images, even grainy spacers of several micrometers in diameter may deteriorate display quality when they exist in the effective display area.

Further, when a liquid crystal material is injected, the flow of the liquid crystal material forces conventional grainy spacers themselves to flow. As a result, a uniform spacer dispersion density profile may not be obtained, to cause a cell thickness variation.

Because of their characteristics, liquid crystal display devices using a ferroelectric liquid crystal that attract much attention recently and reflection-type liquid crystal display devices are required to have small cell gaps.

However, with conventional grainy spacers, it is generally difficult to produce a cell having a small, uniform-profile cell gap.

SUMMARY OF THE INVENTION

An object of the present invention is to provide a semiconductor display device that is free of a cell thickness variation and display unevenness by producing a cell having a small, uniform-profile cell gap that is hard to realize with conventional grainy spacers.

Another object of the invention is to prevent TFTs from being damaged by preventing unnecessary stress that would otherwise be exerted on the TFTs in bonding substrates together when conventional grainy spacers are used.

According to one aspect of the invention, there is provided an electro-optical device comprising a first substrate comprising a pixel area having a plurality of thin-film transistors and a plurality of pixel electrodes electrically connected to the respective thin-film transistors; a driver circuit area provided at a location separate from the pixel area and having a plurality of driver circuits having a plurality of thin-film transistors for driving the thin-film transistors in the pixel area; and a base substrate; a second substrate that confronts the first substrate; a plurality of gap retaining members; and a sealing member for bonding the first and second substrates together, wherein a distance from a surface of the base substrate to a surface of the pixel area is different from a distance from the surface of the base substrate to a surface of the driver circuit area and wherein the gap retaining members are formed in an area other than the pixel area and the driver circuit area. The above objects can be attained by this electro-optical device.

According to another aspect of the invention, there is provided an electro-optical device comprising a TFT substrate comprising a pixel area having a plurality of pixel electrodes arranged in matrix form and a plurality of pixel thin-film transistors electrically connected to the respective pixel electrodes; a driver circuit area having a driver circuit having a plurality of thin-film transistors for driving the pixel thin-film transistors; and a base substrate; an opposed substrate that confronts the TFT substrate; a display medium held between the TFT substrate and the opposed substrate, an optical response of the display medium being controlled by an application voltage; and a plurality of gap retaining members, wherein a distance from a surface of the base substrate to a surface of the pixel area is different from a distance from the surface of the base substrate to a surface of the driver circuit area and wherein the gap retaining members are formed in an area other than the pixel area and the driver circuit area. The above objects can be attained by this electro-optical device.

The above-mentioned optical medium may be such that its optical characteristic is modulated in accordance with the application voltage.

The above-mentioned display medium may be a liquid crystal.

The above-mentioned display medium may be a mixed layer of a liquid crystal material and a polymer.

The above-mentioned display medium may be an electroluminescence element.

The above-mentioned gap retaining members may be formed around the pixel area.

The arrangement density of the above-mentioned gap retaining members may be uniform in the pixel area.

Each of the above-mentioned gap retaining members may be shaped like a cylinder.

Each of the above-mentioned gap retaining members may be shaped like an elliptical pole.

Each of the above-mentioned gap retaining members may be shaped like a polygonal prism.

Each of the above-mentioned gap retaining members may be shaped so as not to obstruct a flow of the liquid crystal when it is injected.

The side face of each of the above-mentioned gap retaining members may be tapered.

The above-mentioned gap retaining members may be made of one material selected from the group consisting of polyimide, acrylic, polyamide, and polyimideamide.

The above-mentioned gap retaining members may be made of an ultraviolet curable resin.

The above-mentioned gap retaining members may be made of an epoxy resin.

According to another aspect of the invention, the top surfaces of the respective gap retaining members on the side of one of the first and second substrates have been planarized by chemical mechanical polishing. In this electro-optical device, since the cell gap is controlled by planarizing the top surfaces of the gap retaining members, a small cell thickness having a uniform profile over the entire electro-optical device can be obtained. Even if the gap retaining members are formed on the pixel area or the driver circuits, a uniform cell thickness profile can be obtained.

To attain the above objects, according to another aspect of the invention, there is provided an electro-optical device comprising a first substrate comprising a pixel area having a plurality of pixel electrodes and switching elements connected to the respective pixel electrodes; a second substrate confronting the first substrate; and a gap retaining member that is provided on the second substrate and retains an interval between the first and second substrates.

To attain the above objects, according to a further aspect of the invention, there is provided an electro-optical device comprising a first substrate comprising a pixel area having a plurality of pixel electrodes and switching elements connected to the respective pixel electrodes; a second substrate confronting the first substrate; a liquid crystal sealed in a space between the first and second substrates; a first alignment film that is formed on a surface of the first substrate and orients a liquid crystal; a second alignment film that is formed on the second substrate and orients the liquid crystal; and a gap retaining member that is provided on the second substrate and retains an interval between the first and second substrates.

In the above two electro-optical devices, the use of the gap retaining members provides the following advantages. First, it is no longer necessary to use spacers. Second, since the height of the gap retaining members can be set as desired, the interval between the substrates can be determined as desired. Third, since the gap retaining members are fixed, they are not gathered unlike the conventional spacers. Therefore, point defects do not occur.

In the above two electro-optical devices, the position of the gap retaining members can be set as desired. For example, the gap retaining members can be provided in an area that substantially confronts the pixel area. In this case, it is preferable that the gap retaining members be provided at locations that are not used for display, for instance, on a black matrix of color filters and bus lines in the pixel area. Alternatively, by providing the gap retaining members in an area that does not confront the pixel area, the interval between the substrates can be retained without causing any influences on the display.

Where the invention is applied to an electro-optical device in which a first substrate (TFT substrate) is provided with a pixel area and a driver circuit area having driver circuits for driving switching elements that are provided in the pixel area, it is preferable that the gap retaining members be provided on a second substrate (opposed substrate) in an area that does not confront the driver circuit area. In this case, it is possible to prevent the driver circuits from being damaged or destroyed by stress that is imposed by the gap retaining members.

According to the invention, since the gap retaining members are provided on the second substrate, influences (solvent or etchant-related influences, mechanical impact, etc.) of the formation of the gap retaining members do not affect the first substrate. Provided with the pixel area and the driver circuits, the first substrate has a much higher integration density than the second substrate. In view of this, the gap retaining members are provided on the second substrate to minimize the number of processes that are executed on the first substrate.

Further, by providing the gap retaining members on the second substrate, the conditions that are set in selecting a material are relaxed. For example, where the invention is applied to a TFT-type liquid crystal display device, since pixel TFTs and driver circuit TFTs are formed in the first substrate (TFT substrate), it is necessary to select a material capable of providing a sufficiently large selective etching ratio to the material of those TFTs.

On the other hand, only such members as an opposed electrode and color filters are formed on the second substrate (opposed substrate), that is, the number of materials used in the second substrate is smaller than in the first substrate. Thus, the number of conditions to be set in selecting a material is small. Further, a material such as that of an etching liquid, an etching gas, or the like and means that are necessary to form the gap retaining members can be selected from wider ranges.

To make it possible to uniformize the interval between the substrates, it is preferable that the gap retaining members be made of a planarization material capable of canceling out the asperity of the base member. For example, the gap retaining members may be made of a resin material selected from polyimide, acrylic, polyamide, and polyimideamide, an ultraviolet curable resin, or a thermosetting resin as typified by an epoxy resin.

The above resin materials are frequently used as interlayer insulating films of the TFT substrate (first substrate). In such a case, it is difficult to provide a large selective etching ratio if the gap retaining members made of a resin material are provided on the TFT substrate. This is the reason why in the invention the gap retaining members are formed on the opposed substrate (second substrate).

DETAILED DESCRIPTION OF THE PREFERRED EMBODIMENTS

Embodiment 1

Figure 1A:
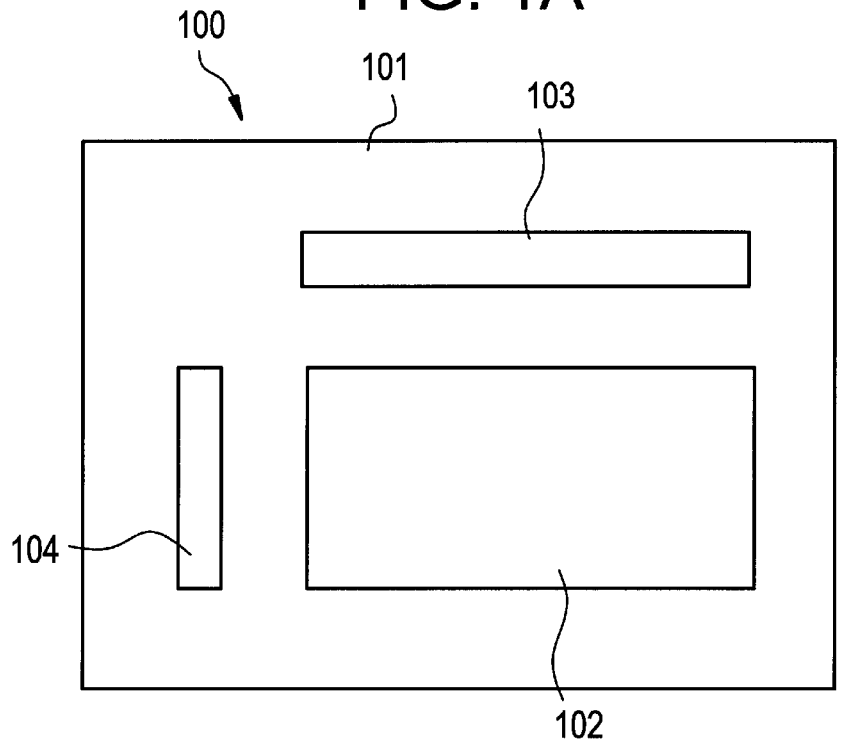
FIGS. 1A–1B are top views of a TFT substrate and an opposed substrate, respectively, according to a first embodiment of the present invention.

This embodiment will be described with reference to FIGS. 1A–1B to 6. This embodiment is directed to a case where the invention is applied to an active matrix liquid crystal display device. FIG. 1A is a top view of a TFT substrate and FIG. 1B is a top view of an opposed substrate.

As shown in FIG. 1A, a TFT substrate 100 consists of a substrate 101 and a pixel area 102 and driver circuit areas 103 and 104 that are formed on the substrate 101. Pixel electrodes, TFTs that are connected to the respective pixel electrodes, and other members are arranged in the pixel area 102. Driver circuits for driving the TFTs in the pixel area 102 are arranged in the driver circuit areas 103 and 104.

Figure 1B:
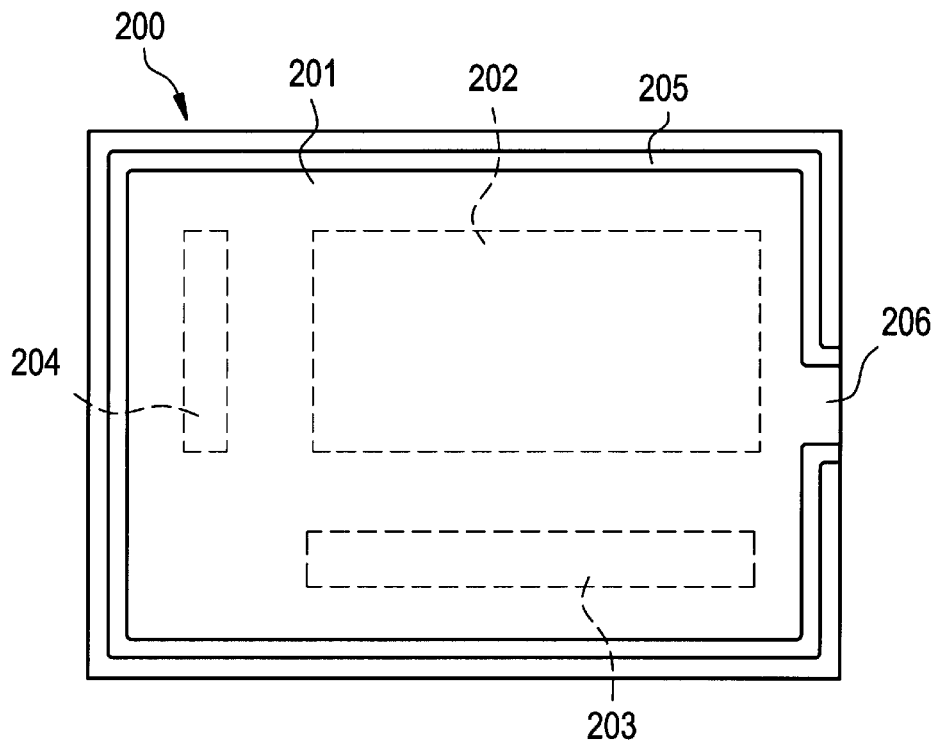

As shown in FIG. 1B, an opposed substrate 200 consists of a substrate 201, an area 202 to confront the pixel area 102 of the TFT substrate 100, and areas 203 and 204 to confront the respective driver circuit areas 103 and 104. The TFT substrate 100 and the opposed substrate 200 are bonded together with a sealing agent 205 that is provided on a peripheral portion of the substrate 201. An opposed electrode is formed in the pixel-confronting area 202 of the opposed substrate 200.

Figure 6:
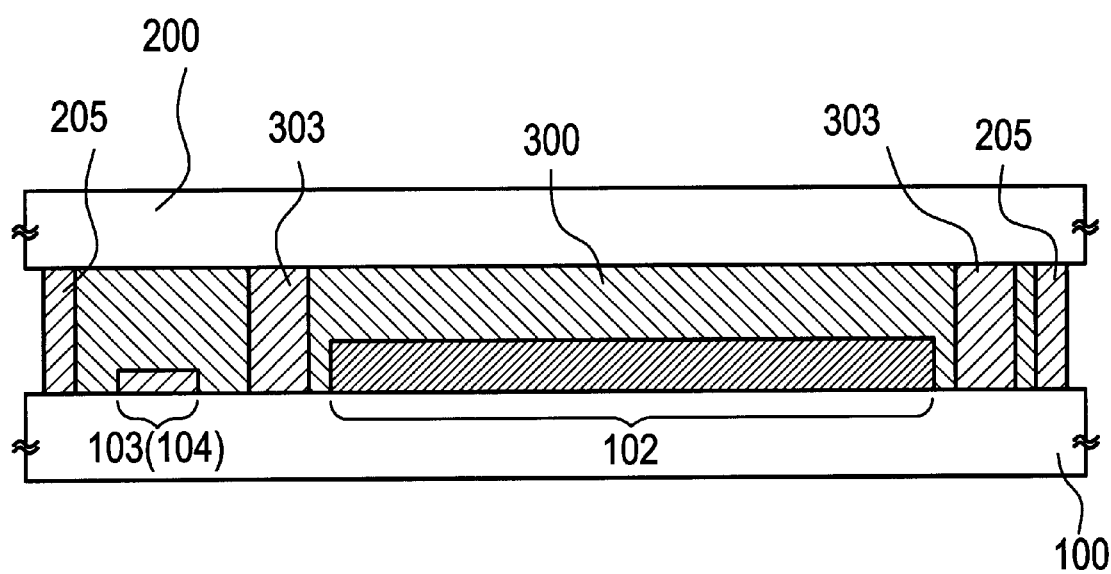
FIG. 6 is a sectional view of the active matrix liquid crystal display device according to the first embodiment.

As shown in FIG. 6, the TFT substrate 100 and the opposed substrate 200 confront each other, a liquid crystal 300 is injected through a liquid crystal injection inlet 206 into the space between the substrates 100 and 200, and the liquid crystal is sealed with a sealing agent 205. Alignment films for giving proper alignment to the liquid crystal are formed to constitute the surfaces of the TFT substrate 100 and the opposed substrate 200.

Next, a manufacturing method of the TFT substrate 100 will be described with reference to FIGS. 2A–2E and 3A–3B. The right-hand portions of FIGS. 2A–2E and 3A–3B show a manufacturing process of a TFT that is to be formed in the pixel area 102 and the left-hand portions show a manufacturing process of TFTs to be formed in the driver circuit areas 103 and 104, respectively.

Figure 2A:
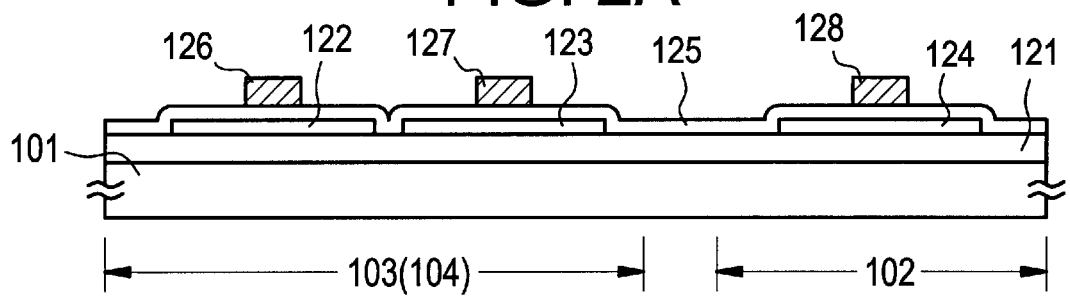
FIGS. 2A–2E and 3A–3B show a manufacturing process of the TFT substrate according to the first embodiment.

First, as shown in FIG. 2A, a silicon oxide film as an undercoat insulating film 121 for preventing impurity diffusion from a glass substrate 101 is formed on the glass substrate 101 at a thickness of 100–300 nm. The silicon oxide film may be formed by sputtering or plasma CVD in an oxygen atmosphere. In this embodiment, a 200-nm-thick silicon oxide film is formed by plasma CVD by using a TEOS gas as a material. If a quartz substrate is used as the substrate 101, the undercoat insulating film 121 can be omitted.

Then, an amorphous or polycrystalline silicon film is formed at a thickness of 30–150 nm, preferably 50–100 mn, by plasma CVD or LPCVD. To crystallize the silicon film, thermal annealing is performed at a temperature higher than 500° C., preferably 800°–900° C. After the silicon film is crystallized by thermal annealing, optical annealing may be performed to improve the crystallinity. Further, as disclosed in Japanese Unexamined Patent Publication No. Hei. 6-244104, the crystallization of silicon may be accelerated by adding such an element as nickel (catalyst element) in crystallizing the silicon film by thermal annealing.

In this embodiment, after a 50-nm-thick amorphous silicon film is formed by plasma CVD, hydrogen is removed by performing a heat treatment at 450° C. for one hour and then the amorphous silicon film is converted into a polycrystalline silicon film by illuminating it with excimer laser light. The polycrystalline silicon film is patterned into island-like active layers (a p-channel TFT active layer 122 and an n-channel TFT active layer 123) of peripheral driver circuit TFTs and an island-like active layer 124 of a pixel TFT. Although for convenience FIGS. 2A–2E show only three TFTs, actually millions of TFTs are formed at the same time.

A gate insulating film 125 is then formed. In this embodiment, a 120-nm-thick insulating film is formed by plasma CVD by using, as a material gas, a mixed gas of dinitrogen monoxide ($N_2O$) and monosilane ($SiH_4$).

Thereafter, a 300-nm-thick aluminum film is formed by sputtering and then patterned into gate electrodes 126–128.

Figure 2B:
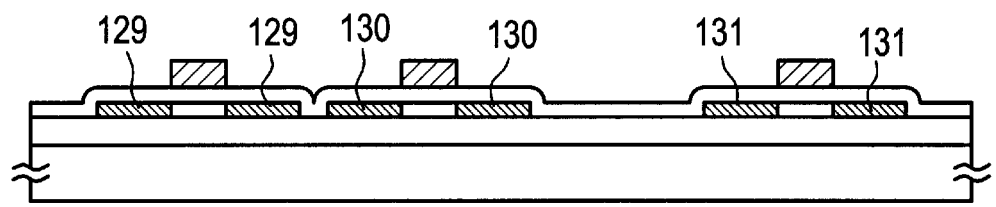

Then, as shown in FIG. 2B, all the island-like active layers 122–124 are doped with phosphorus ions in a self-aligned manner by ion doping with the gate electrodes 126–128 used as a mask. Phosphine ($PH_3$) is used as a doping gas and the dose is set at $1 \times 10^{12}$ to $5 \times 10^{13}$ atoms/$cm^2$. As a result, weak n-type regions (n regions) 129–131 are formed.

Figure 2C:
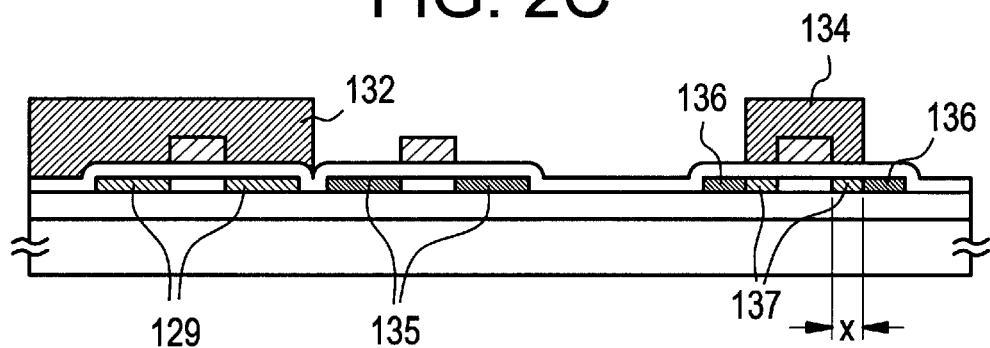
Figure 2D:
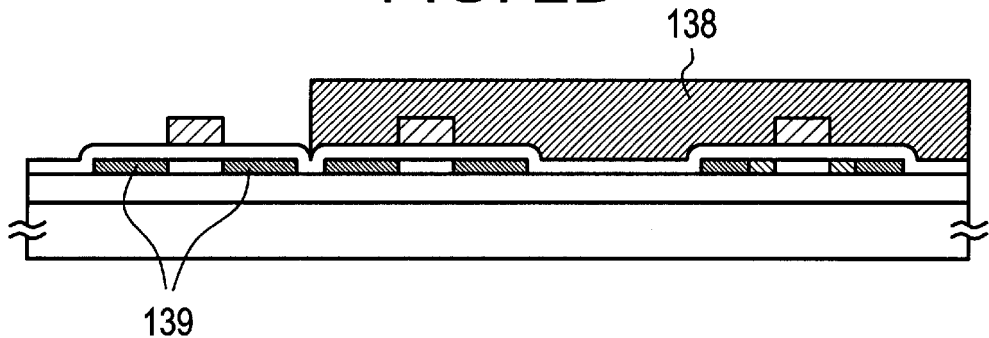

Then, as shown in FIG. 2C, a photoresist mask 132 is formed so as to cover the entire p-channel TFT active layer 122 and photoresist 134 is formed so as to cover part of the pixel TFT active layer 124. The mask 134 is formed so as to cover a portion that ends at positions distant from the respective ends of the gate electrode 128 by 3 μm as measured parallel with the gate electrode 128.

Then, phosphorus ions are again implanted by ion doping. Phosphine is used as a doping gas and the dose is set at $1 \times 10^{14}$ to $5 \times 10^{15}$ atoms/cm$^2$. As a result, sources/drains 135 and 136 are formed as strong n-type regions (n$^+$ regions). In this doping step, no phosphorus ions are implanted into regions 137, covered with the mask 134, of the weak n-type regions (n regions) 131 of the pixel TFT active layer 124. Therefore, the regions 137 remain of the weak n type. The width x of the low-concentration impurity regions 137 is about 3 μm.

Then, as shown in FIG. 5D, the n-channel TFT active layers 123 and 124 are covered with a photoresist mask 138. Thereafter, boron is implanted into the island-like region 122 by ion doping by using diborane ($B_2H_6$) as a doping gas. The dose is set at $5 \times 10^{14}$ to $8 \times 10^{15}$ atoms/cm$^2$. Since the boron dose in this doping is higher than the phosphorus dose in the doping of the step of FIG. 2B, the weak n-type regions 130 are inverted to strong p-type regions 139.

Subsequently, thermal annealing is performed at 450°–850° C. for 0.5–3 hours to activate the doping impurities and restore the crystallinity of silicon. As a result of this thermal annealing step, damage of the silicon film that has been caused by the doping steps is repaired.

As a result of the above doping steps, an n-type TFT having the strong n-type regions 135 as a source and a drain and a p-type TFT having strong p-type regions 139 as a source and a drain are formed in the driver circuit area 103 (104). Further, an n-type TFT having the strong n-type regions 136 as a source and a drain and the weak n-type low-concentration impurity regions 137 is formed in the pixel area 102 (see FIG. 2D).

Figure 2E:
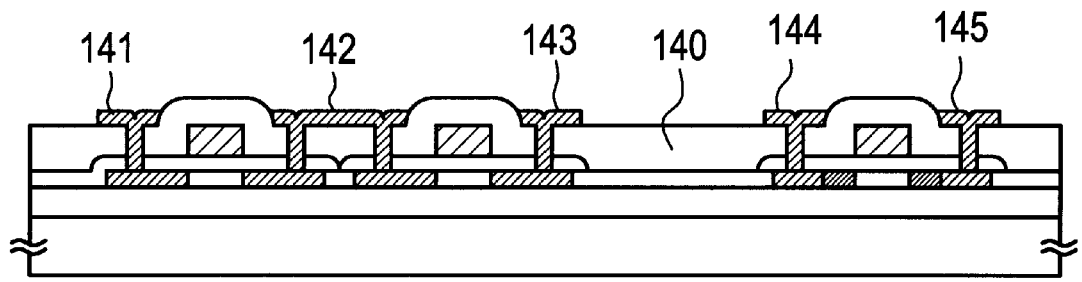

Then, a first interlayer insulating film 140 is formed as shown in FIG. 2E. In this embodiment, a 500-nm-thick silicon nitride film is formed by plasma CVD. The first interlayer insulating film 140 may be another type of single layer film such as a silicon oxide film or a silicon oxynitride film, or a multilayered film of a silicon nitride film and a silicon oxide film or of a silicon nitride film and a silicon oxynitride film. Thereafter, contact holes are formed through the first interlayer insulating film 140 by etching it.

Thereafter, a titanium/aluminum/titanium multilayered film is formed by sputtering and then etched into driver circuit electrodes/interconnections 141–143 and pixel TFT electrodes/interconnections 144 and 145. In this embodiment, the thickness of each titanium film is set at 100 nm and the thickness of the aluminum film is set at 300 nm.

Figure 3A:
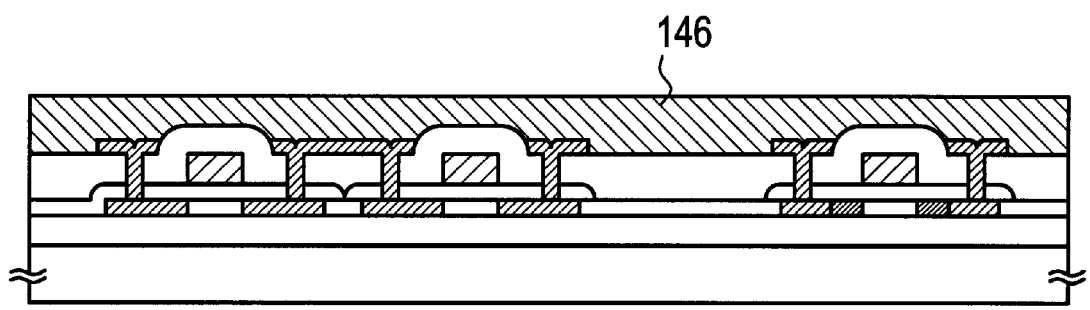

Then, as shown in FIG. 3A, an organic resin film as a second interlayer insulating film 146 is formed at a thickness of 1.0–2.0 μm. The organic resin may be polyimide, polyamide, polyimideamide, polyacrylic, or the like. In this embodiment, a 1.5-μm-thick polyimide film is formed as the second interlayer insulating film 146.

Figure 3B:
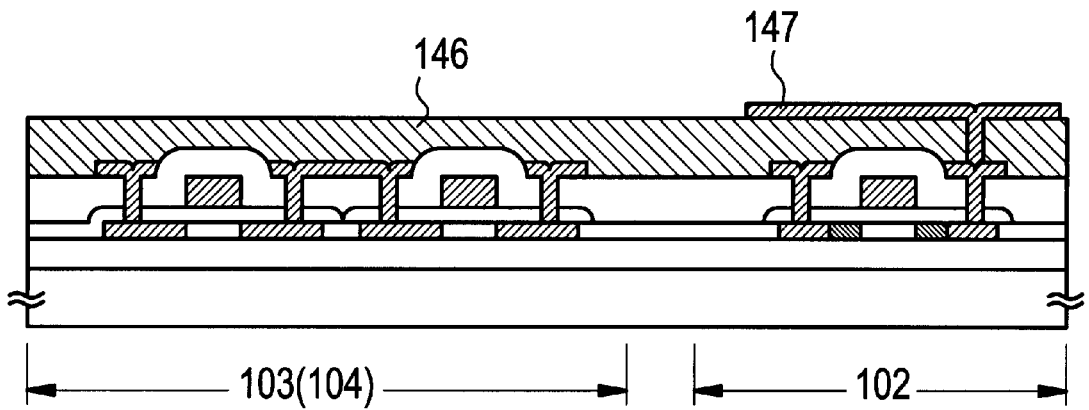

Then, a contact hole reaching the pixel TFT electrode 525 is formed by photolithography. Thereafter, as shown in FIG. 3B, a pixel electrode 147 is formed by forming a 300-nm-thick aluminum film to which titanium is added at 1 wt % and then patterning it.

In the pixel area 102 of the TFT substrate 100 shown in FIG. 18A, at least one TFT is provided for and electrically connected to each pixel electrode. Examples of driver circuits formed in the driver circuit areas 103 and 104 are a shift register and an address decoder. Other circuits may also be formed when necessary.

In this manner, driver circuit TFTs and pixel TFTs are formed in an integral manner in the driver circuit areas 103 and 104 and the pixel area 102, respectively. In this embodiment, the number of pixels is set at 1,024 (vertical)× 768 (horizontal). In this specification, an area where pixel TFTs including the end pixel TFTs exist is called the pixel area 102 and an area where driver circuit TFTs including the end driver circuit TFTs exist is called the driver circuit area 103 (104).

The TFT substrate 100 is cleaned sufficiently to remove various chemicals such as etching liquids and resist removers that were used for the surface processing in forming the TFTs.

Next, a process of forming gap retaining members will be described. In the following description, the configurations of the driver circuit areas 103 and 104 where driver circuit TFTs 160 are formed and the pixel area 102 where pixel TFTs 150 are formed are simplified as shown in FIGS. 4A–4D. In FIGS. 4A–4D, for convenience, the scales of the respective parts are different.

Figure 4A:
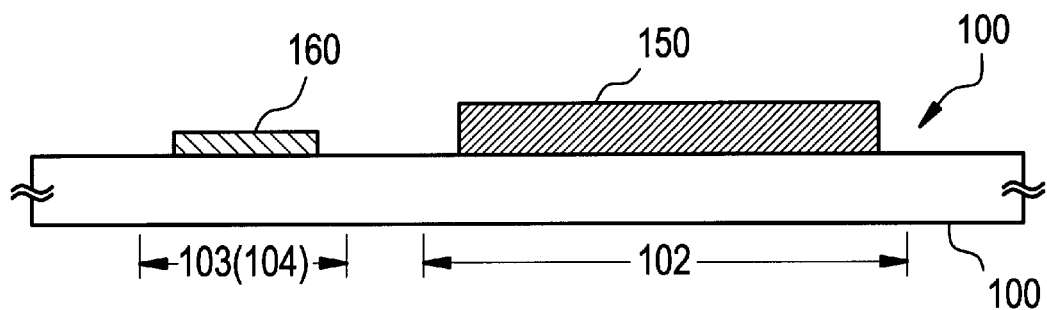
FIGS. 4A–4D show a manufacturing process of gap retaining members according to the first embodiment.
Figure 4B:
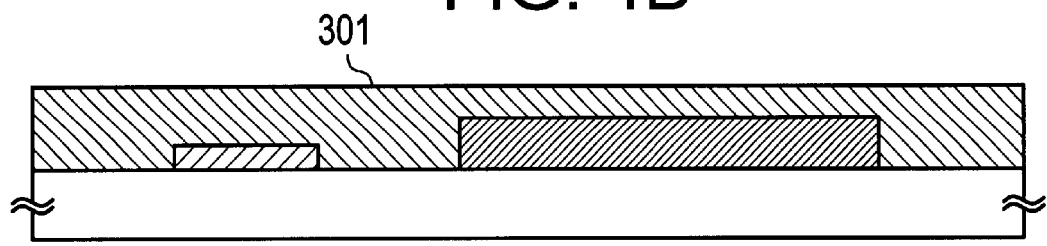

First, as shown in FIG. 4B, a 2.2-μm-thick photosensitive polyimide film 301 is formed by spin coating. Thereafter, the substrate is left at the room temperature for 30 minutes to uniformize the thickness of the photosensitive polyimide film 301 over the entire TFT substrate 100 (leveling). Then, the TFT substrate 100 on which the photosensitive polyimide film 301 is formed is pre-baked at 120° C. for 3 minutes.

Figure 4C:
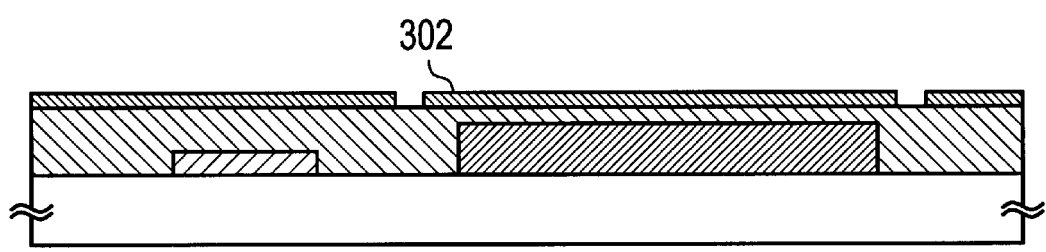
Figure 4D:
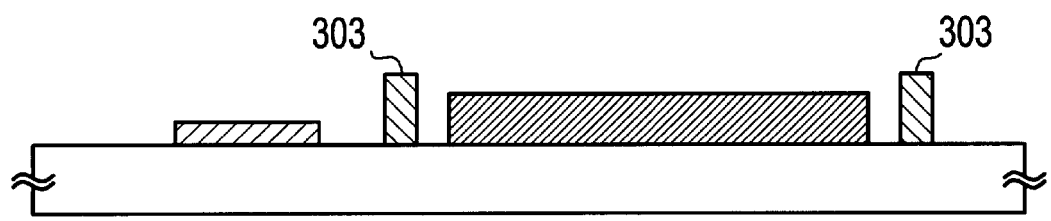

Then, the photosensitive polyimide film 301 is patterned in the following manner. As shown in FIG. 4C, after the photosensitive polyimide film 301 is covered with a photomask 302, ultraviolet light is applied to the TFT substrate 100 from above. Subsequently, development is performed and then post-baking is performed at 280° C. for one hour. Patterned gap retaining members 303 are thus formed as shown in FIG. 4D.

Figure 5A:
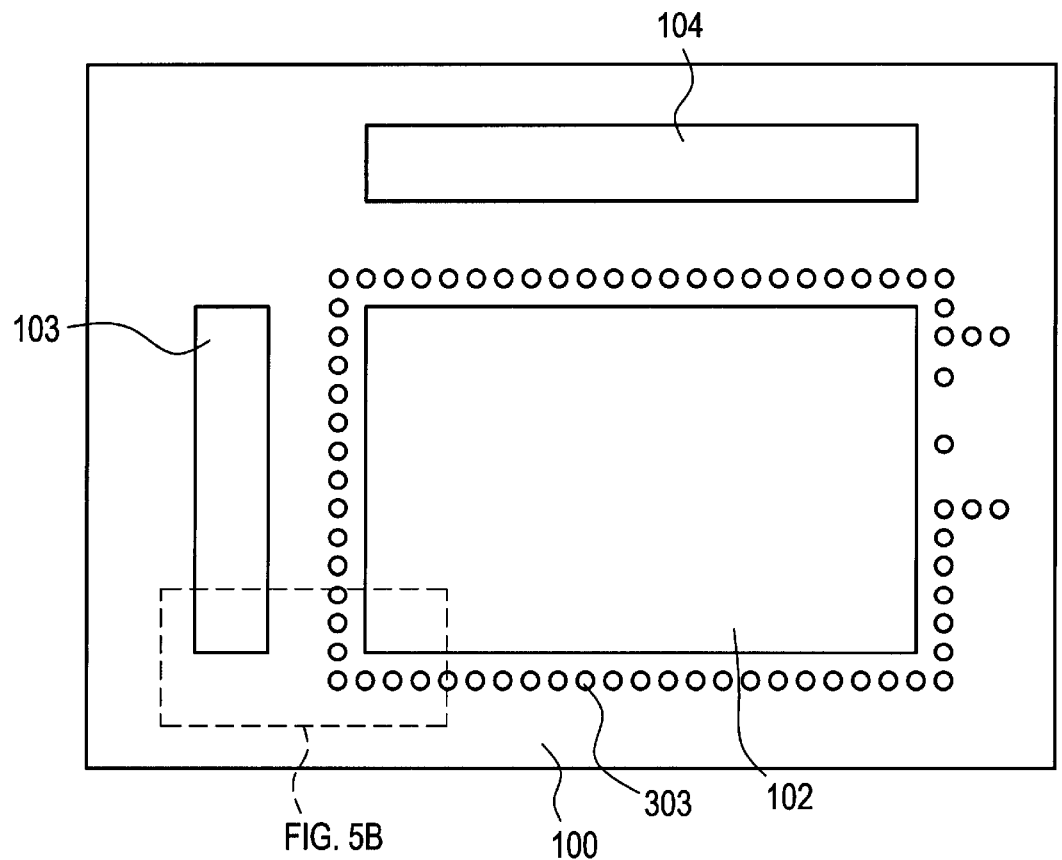
FIGS. 5A and 5B are a top view and a perspective view, respectively, of an active matrix liquid crystal display device according to the first embodiment.
Figure 5B:
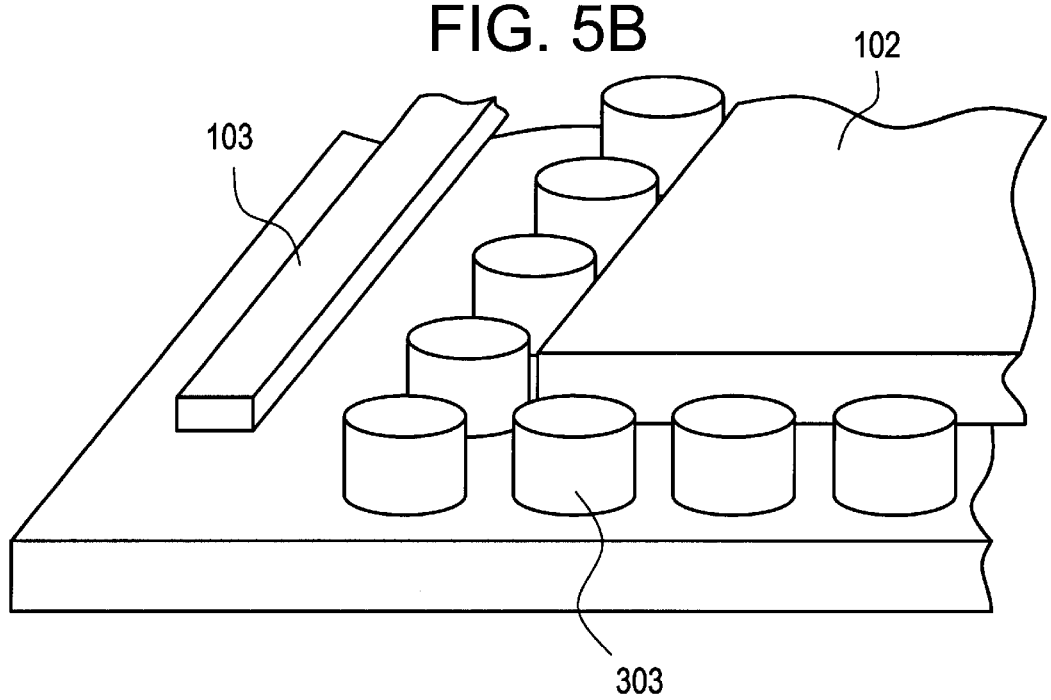

FIG. 5A is a top view of the TFT substrate according to this embodiment, and FIG. 5B is an enlarged perspective view of a part of the TFT substrate that is indicated by a broken line in FIG. 5A. In FIGS. 5A and 5B, for convenience, the scales of the gap retaining members 303, the pixel area 102, and the driver circuit areas 103 and 104 are different from each other. In this embodiment, as shown in FIGS. 5A and 5B, the gap retaining members 303 are shaped like a cylinder of 10 μm in diameter and 2.2 μm in height. The gap retaining members 303 are formed at regular intervals of 30 μm so as to surround the pixel area 102 at a distance of about 70 μm from the end pixel TFTs. The arrangement density of the gap retaining members 303 in the vicinity of the liquid crystal injection inlet is set lower than in the other portions. It is preferable that the arrangement density of the gap retaining members 303 be uniform.

In the gap retaining members 303 of the invention, the accuracy of their height is important. In this embodiment, the height accuracy of the gap retaining members 303 is set at ±0.1 μm. On the other hand, it is sufficient that the positional accuracy of the gap retaining members 303 be about ±10 μm. In this embodiment, part of the gap retaining members 303 are formed between the pixel area 102 and the driver circuit areas 103 and 104. In this embodiment, the intervals between the pixel area 102 and the driver circuit areas 103 and 104 are about 400 nm, which is sufficiently longer than the diameter of the gap retaining members 303. Therefore, the positional accuracy of the gap retaining members 303 is not much important. The gap retaining members 303 are not formed inside the pixel area 102 and the driver circuit areas 103 and 104.

Although in this embodiment the gap retaining members 303 are shaped like a cylinder, they may be shaped like an ellipse, a streamlined shape, or a polygon such as a triangle or a rectangle. The gap retaining members 303 may have any shape as long as they can control the gap between the TFT substrate (first substrate) 100 and the opposed substrate (second substrate) 200. Although in this embodiment all the gap retaining members 303 have the same shape and are arranged at regular intervals, gap retaining members having plural kinds of shapes may be arranged at different intervals. Although in this embodiment the gap retaining members 303 are formed at the constant distance from the pixel area 102, they may be formed at different distances from pixel area 102. Further, although in this embodiment the gap retaining members 303 are formed so as to surround the pixel area 102, they may be formed anywhere except the insides of the pixel area 102 and the driver circuit areas 103 and 104 as long as they can control the cell gap.

Then, alignment films are formed on the TFT substrate 100 and the opposed substrate 200. Specifically, the TFT substrate 100 and the opposed substrate 200 are coated with polyimide-type vertical alignment films by one of spin coating, flexography, and screen printing. In this embodiment, 1,000-Å-thick alignment films are formed by spin coating. Then, the alignment films are cured by baking in which a hot wind of 180° C. is fed.

Then, rubbing is performed in which the surface of the opposed substrate 200, i.e., the surface of the alignment film, is rubbed in one direction with a buff cloth (fiber of rayon, nylon, or the like) having hair lengths of 2–3 mm. In this embodiment, rubbing is not performed on the TFT substrate 100 side.

Thereafter, a sealing agent 205 is applied to the opposed substrate 200 along its periphery (see FIG. 1B). Alternatively, the sealing agent 205 may be applied to the TFT substrate 100 side. The TFT substrate 100 and the opposed substrate 200 are then bonded together (see FIG. 6).

Then, a liquid crystal material 300 as a display medium is injected through a liquid crystal injection inlet 206, whereby the liquid crystal material 300 is held between the TFT substrate 100 and the opposed substrate 200. In this embodiment, since the gap retaining members 303 are shaped like a cylinder, the flow resistance that occurs between the liquid crystal material 300 and the surfaces of the gap retaining members 303 in injecting the liquid crystal material 300 is small. Therefore, the liquid crystal material 300 can be injected uniformly over the entire substrate surfaces. It is preferable that the gap retaining members 303 be shaped and arranged so as to reduce the flow resistance.

Then, after a sealing agent (not shown) is applied to the liquid crystal injection inlet 206, the sealing agent is cured by illuminating it with ultraviolet light. The liquid crystal material 300 is thus completely sealed in the cell.

When the display characteristics of cells actually manufactured in the above manner were checked, no interference fringe was observed on the cell surfaces. Further, superior display performance with no disclination was obtained.

Embodiment 2

In this embodiment, the steps until pixel TFTs and driver circuit TFTs are formed to constitute a TFT substrate are the same as in the first embodiment and hence are not described here.

Figure 7A:
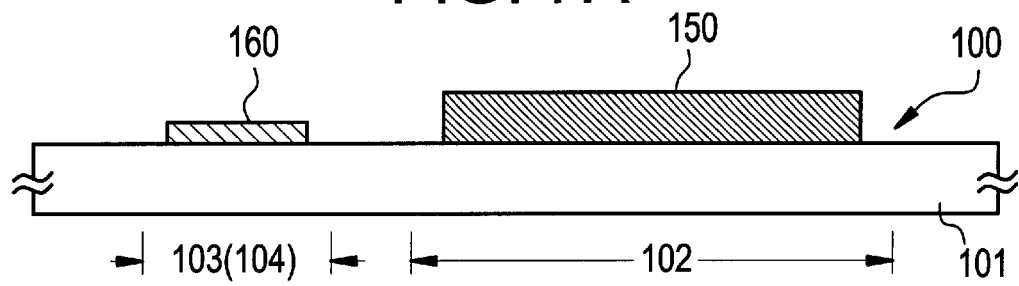
FIGS. 7A–7D and 8A–8B show a manufacturing process of an active matrix liquid crystal display device according to a second embodiment of the invention.

After the pixel TFTs and the driver circuit TFTs are formed in an integral manner to constitute the TFT substrate, gap retaining members are formed on the TFT substrate as shown in FIG. 3B. A process of forming gap retaining members according to this embodiment will be described below with reference to FIGS. 7A–7D and 8A–8C. The configuration of FIG. 7A is the same as that of FIG. 4A.

Figure 7B:
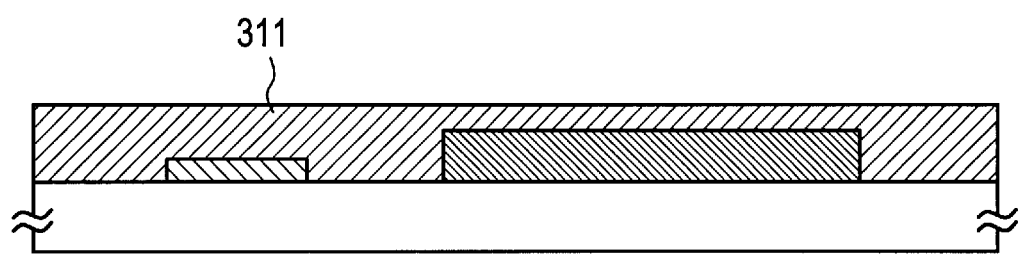

First, as shown in FIG. 7B, a 2.2-μm-thick photosensitive polyimide film 311 is formed by spin coating. Thereafter, the substrate is left at the room temperature for 30 minutes to uniformize the thickness of the photosensitive polyimide film 311 over the entire TFT substrate 100 (leveling). Then, the TFT substrate 100 on which the photosensitive polyimide film 311 is formed is pre-baked at 120° C. for 3 minutes.

Figure 7C:
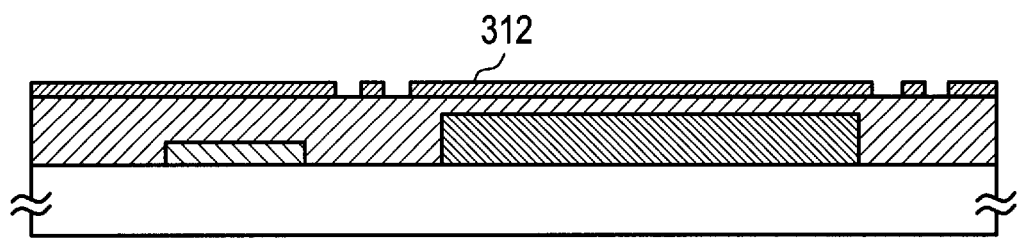
Figure 7D:
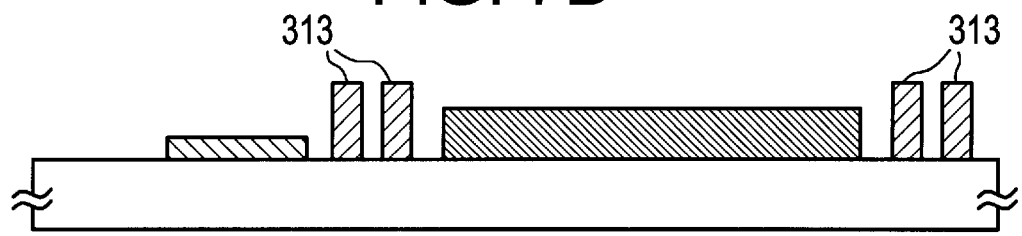

Then, the photosensitive polyimide film 311 is patterned in the following manner. As shown in FIG. 7C, after the photosensitive polyimide film 311 is covered with a photomask 312, ultraviolet light is applied to the TFT substrate 100 from above. Subsequently, development is performed, the photomask 312 is removed, and then post-baking is performed at 280° C. for one hour. As a result, cylindrical gap retaining members 313 are formed (see FIG. 7D).

Figure 8A:
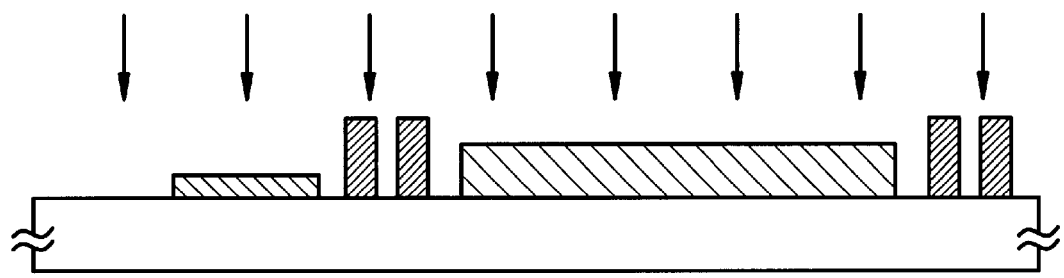
Figure 8B:
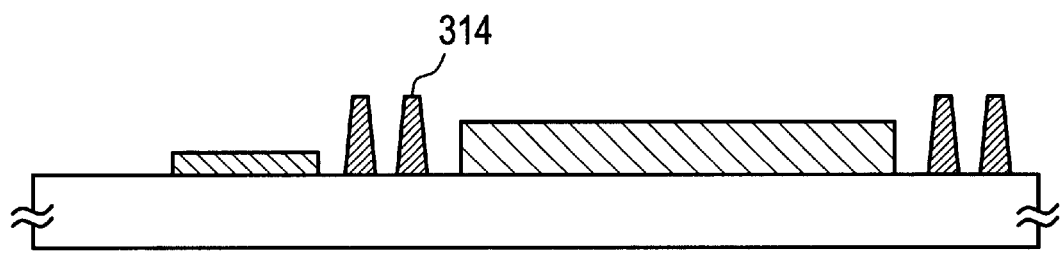
Figure 8C:
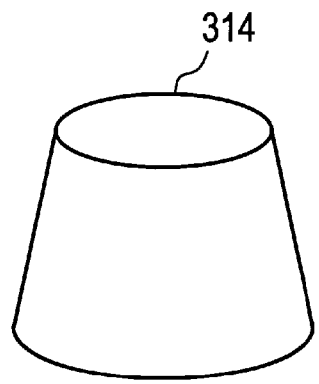
FIG. 8C is an enlarged view of a gap retaining member according to the second embodiment.

Thereafter, a resist film is applied uniformly and patterned into a desired pattern. In this embodiment, a resist film (not shown) is formed on the top faces of the cylindrical gap retaining members 313. Subsequently, as shown in FIG. 8A, the shape of the gap retaining members 313 is modified by applying oxygen plasma to those. Since the top surfaces of the gap retaining members 313 are protected by the resist film (not shown), only their side faces are etched (ashed), whereby gap retaining members 314 having tapered side faces are formed as shown in FIG. 8B. After completion of the etching, the resist film is removed. FIG. 8C is an enlarged view of a gap retaining member 314. Each gap retaining member 314 is shaped like a truncated cone in which the bottom face diameter is 30 μm, the top face diameter is 20 μm, and the height is 2.2 μm.

Figure 9:
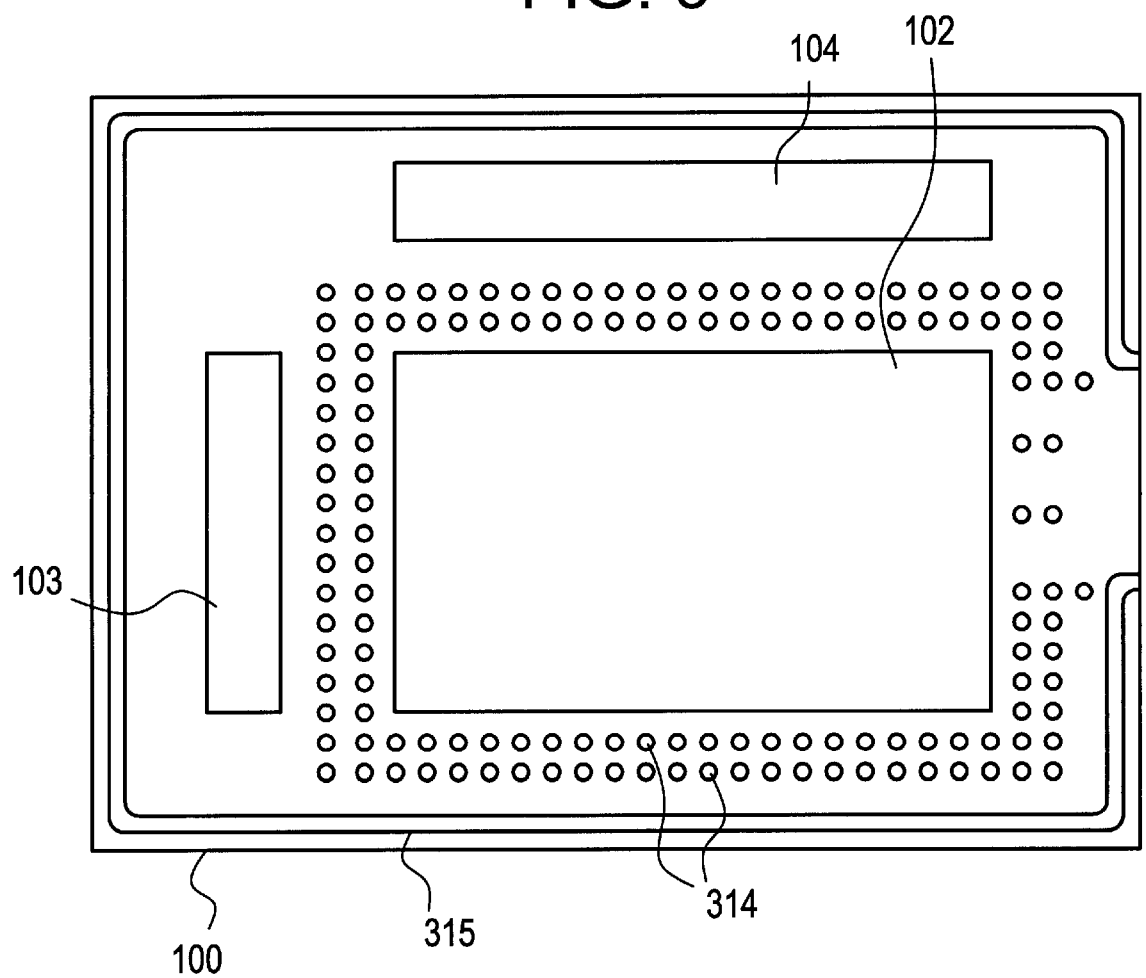
FIG. 9 is a top view of the active matrix liquid crystal display device according to the second embodiment.

FIG. 9 is a top view of the TFT substrate 100 according to this embodiment. The patterned cell gas retaining members 314 have been formed by the above process. In this embodiment, as shown in FIG. 9, the gap retaining members 314 are formed so as to doubly surround the pixel area 102.

Thereafter, alignment films are formed on the TFT substrate 100 and the opposed substrate 200 in the same manner as in the first embodiment.

Then, rubbing is performed on the surface of the opposed substrate 200, i.e., the surface of the alignment film, and a sealing agent 315 is applied to the TFT substrate 100 (see FIG. 9). The TFT substrate 100 and the opposed substrate 200 are then bonded together (not shown). In FIG. 9, the same reference numerals as in FIGS. 1A and 1B denote the same members as in FIGS. 1A and 1B.

Then, a liquid crystal material as a display medium is injected through a liquid crystal injection inlet. In this embodiment, since the side faces of the gap retaining members 314 are tapered, the resistance that occurs between the liquid crystal material and the gap retaining members 314 in injecting the liquid crystal material is small. Therefore, the liquid crystal material can be injected uniformly over the entire substrates. Then, the liquid crystal material is completely sealed in the cell by sealing the liquid crystal injection inlet with a sealing agent (not shown).

The uniformity of the cell thickness can be improved by increasing the number of gap retaining members 314, particularly by increasing the number of gap retaining members 314 in the vicinity of the pixel area 102. When the display characteristics of cells actually manufactured in the above manner were checked, no interference fringe was observed on the cell surfaces. Further, superior display performance with no disclination was obtained.

Embodiment 3

Figure 10:
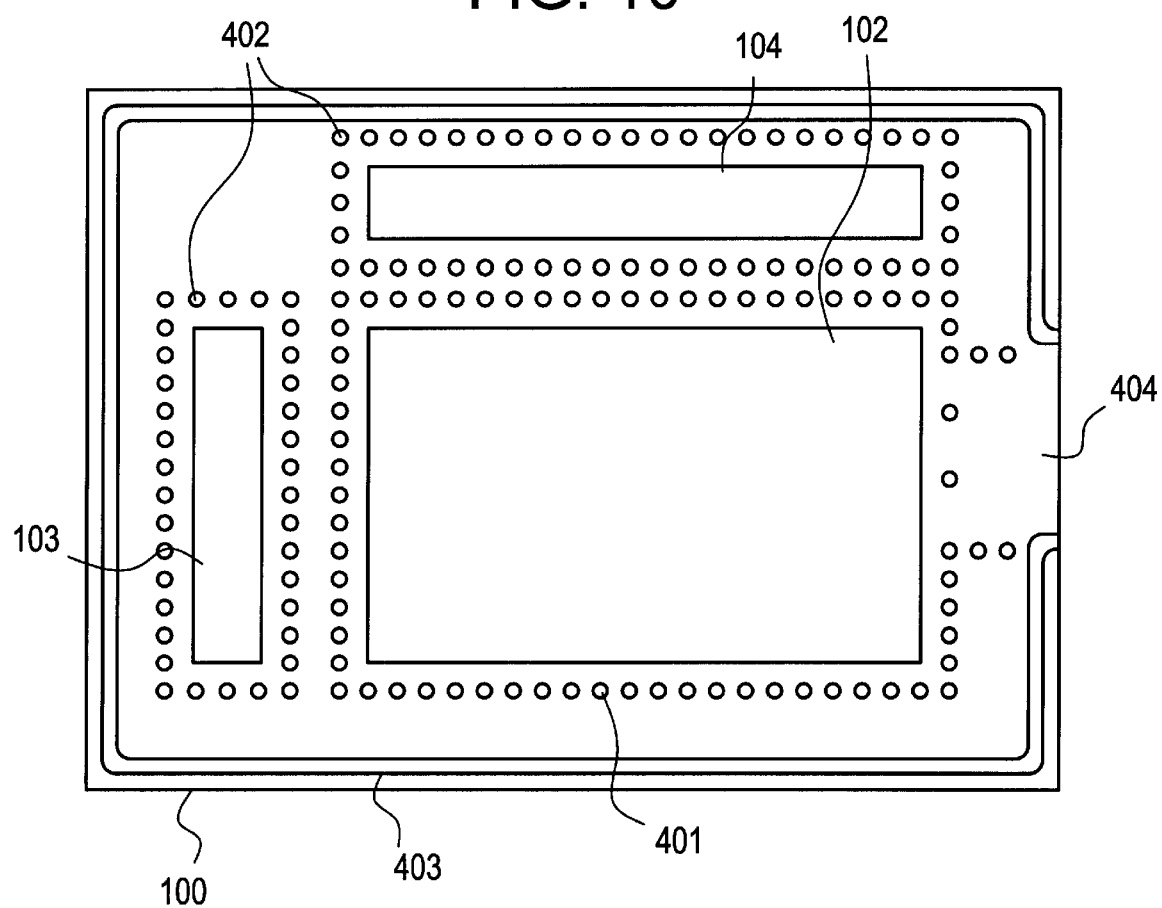
FIG. 10 is a top view of an active matrix liquid crystal display device according to a third embodiment of the invention.

This embodiment is different from the first embodiment only in the number and arrangement of gap retaining members. Since this embodiment is the same as the first or second embodiment in the other points, a manufacturing process will not be described. In FIG. 10, the same reference numerals as in FIGS. 1A and 1B and FIG. 9 denote the same members as in the latter figures. In this embodiment, a sealing agent 403 is formed on the TFT substrate 100 side.

In this embodiment, as shown in FIG. 10, gap retaining members 401 are formed on the TFT substrate 100 so as to surround the pixel area 102 and gap retaining members 402 are formed on the TFT substrate 100 so as to surround the driver circuit areas 103 and 104. The gap retaining members 401 and 402 are shaped like a cylinder of 30 μm in diameter and 2.2 μm in height.

Then, rubbing is performed on the surface of the opposed substrate 200, i.e., the surface of an alignment film, and a sealing agent 403 is applied to the TFT substrate 100 (see FIG. 10). The TFT substrate 100 and the opposed substrate 200 are then bonded together (not shown).

Then, a liquid crystal material as a display medium is injected through a liquid crystal injection inlet 404, and the liquid crystal material is completely sealed in the cell by sealing the liquid crystal injection inlet 404 with a sealing agent (not shown).

When the display characteristics of cells actually manufactured in the above manner were checked, no interference fringe was observed on the cell surfaces. Further, superior display performance with no disclination was obtained.

Embodiment 4

In this embodiment, the steps until pixel TFTs and driver circuit TFTs are formed to constitute a TFT substrate are the same as in the first embodiment and hence are not described here.

A TFT substrate 100 is produced as shown in FIG. 3B according the steps described in the first embodiment. A process of forming gap retaining members according to this embodiment will be described below with reference to FIGS. 11A–11C.

Figure 11A:
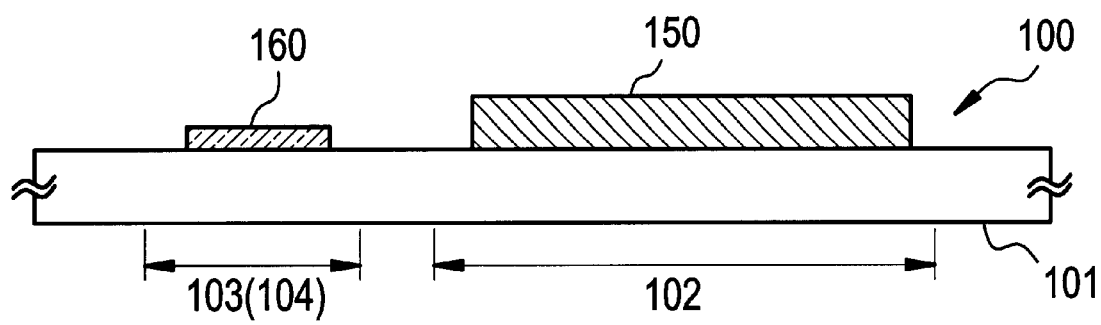
FIGS. 11A–11C show a manufacturing process of an active matrix liquid crystal display device according to a fourth embodiment of the invention.

The configuration of FIG. 11A is the same as that of FIG. 3B. In this embodiment, gap retaining members 503 are formed by printing on the TFT substrate 100 in which pixel TFTs 150 and driver circuit TFTs 160 are formed. In this embodiment, the gap retaining members 503 are made of a polyimide resin.

Figure 11B:
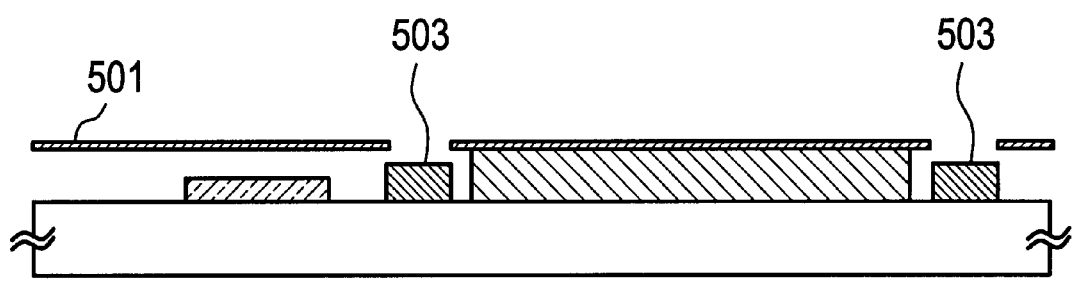
Figure 11C:
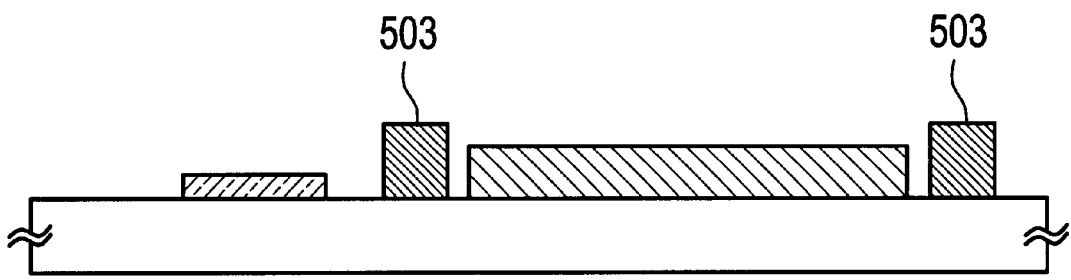

Specifically, as shown in FIG. 11B, gap retaining members 503 are formed by covering the TFT substrate 100 with a screen 501 and then printing a polyimide resin. In this embodiment, gap retaining members 503 of 1.1 μm in height are formed by a single printing operation. Gap retaining members 503 having a desired height are formed by repeating the steps of printing a polyimide resin, baking it for a while, and again printing a polyimide resin so that it is superimposed on the previous polyimide resin.

Figure 12A:
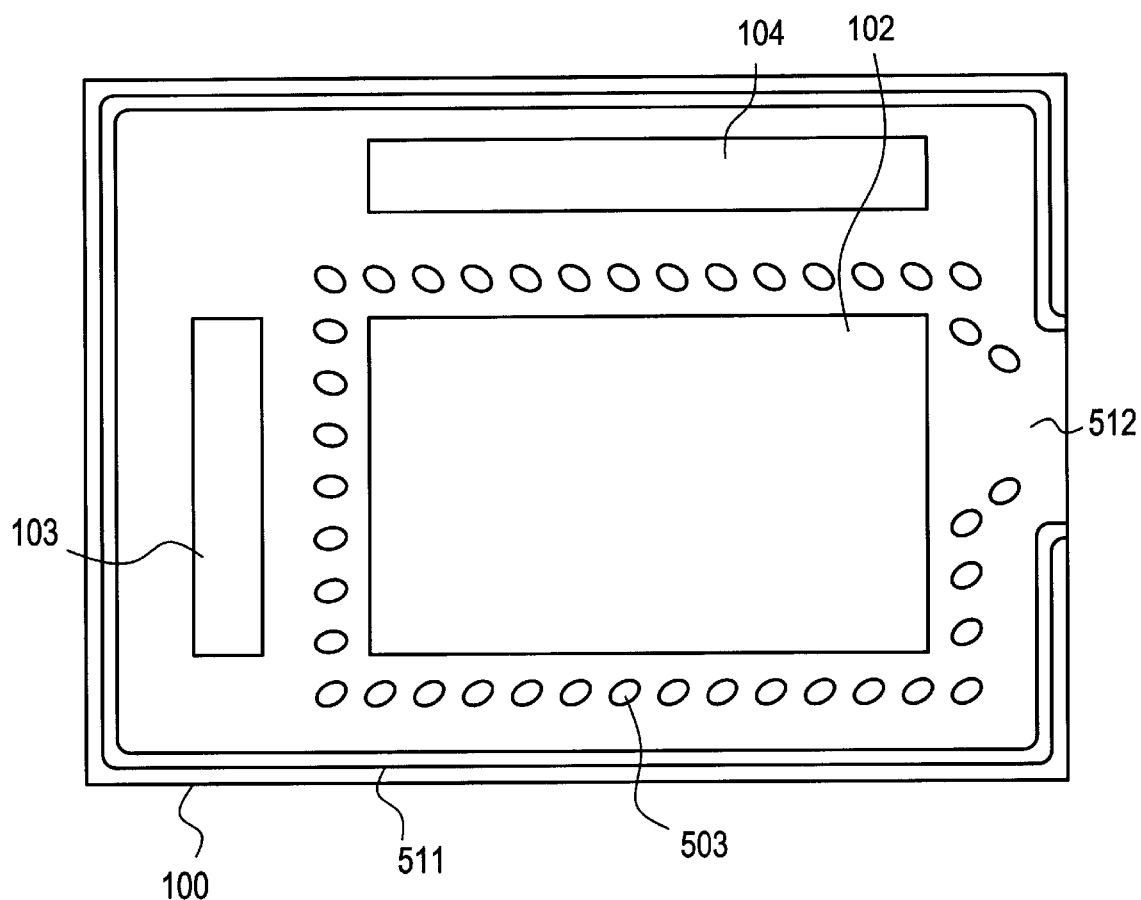
FIG. 12A is a top view of the active matrix liquid crystal display device according to the fourth embodiment.

FIG. 12A is a top view showing the TFT substrate 100 on which the gap retaining members 503 are formed. In FIG. 12A, the same reference numerals as in FIGS. 1A and 1B and FIG. 9 denote the same members as in the latter figures. In this embodiment, a sealing member 511 is formed on the TFT substrate 100 side.

Figure 12B:
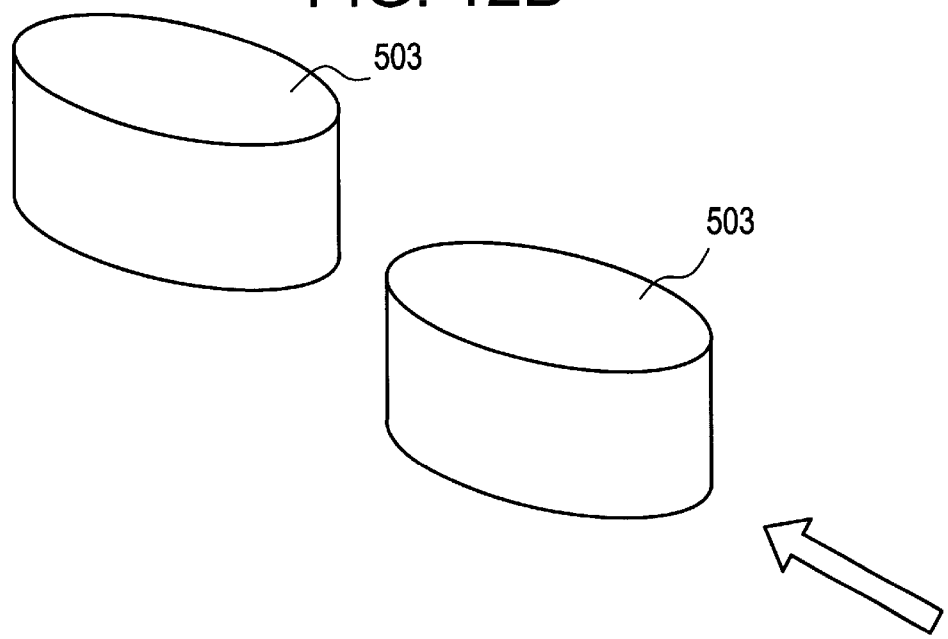
FIG. 12B is an enlarged view showing a relationship between gap retaining members and a liquid crystal material flowing direction in the fourth embodiment.

In this embodiment, the gap retaining members 503 are shaped like an elliptical pole in which the major axis length is 30 μm, the minor axis length is 15 μm, and the height is 2.2 μm, and are arranged so as to surround the pixel area 102. Further, in this embodiment, the gap retaining members 503 are arranged so as to reduce the resistance that occurs between the gap retaining members 503 and a liquid crystal material in injecting the liquid crystal material. That is, the gap retaining members 503 are arranged so that the major axes of the gap retaining members 503 are parallel with the flowing direction of the liquid crystal material that is injected through a liquid crystal injection inlet (see FIG. 12B).

Then, alignment films are formed on the surfaces of the TFT substrate 100 and the opposed substrate 200. Specifically, the TFT substrate 100 and the opposed substrate 200 are coated with 100-nm-thick, polyimide-type vertical alignment films (not shown) by one of spin coating, flexography, and screen printing. Then, the alignment films are cured by baking in which a hot wind of 180° C. is fed.

Thereafter, a sealing agent 511 is applied to a peripheral portion of the TFT substrate 100 so as to leave a liquid crystal injection inlet 512, and the TFT substrate 100 and the opposed substrate 200 are bonded together (not shown).

Then, a liquid crystal material is injected through the liquid crystal injection inlet 512. In this embodiment, the gap retaining members 503 are shaped like an elliptical pole and are arranged so as to reduce the resistance that occurs between the gap retaining members 503 and the liquid crystal material in injecting the liquid crystal material. Therefore, the liquid crystal material can be injected uniformly over the entire substrates.

Thereafter, a sealing agent (not shown) is applied to the liquid crystal injection inlet 512 and then cured by illuminating it with ultraviolet light. The liquid crystal material is thus completely sealed in the cell.

Embodiment 5

This embodiment is directed to a method of forming gap retaining members that is different from in the first embodiment.

First, a TFT substrate 100 is produced according to the steps described in the first embodiment. The TFT substrate 100 is cleaned sufficiently to remove various chemicals such as etching liquids and resist removers that were used for the surface processing in forming the TFTs.

Next, a process of forming gap retaining members will be described with reference to FIGS. 13A–13C and 14A–14B. In these figures, for convenience, the scales of gap retaining members formed and the TFTs are made different from each other.

Figure 13A:
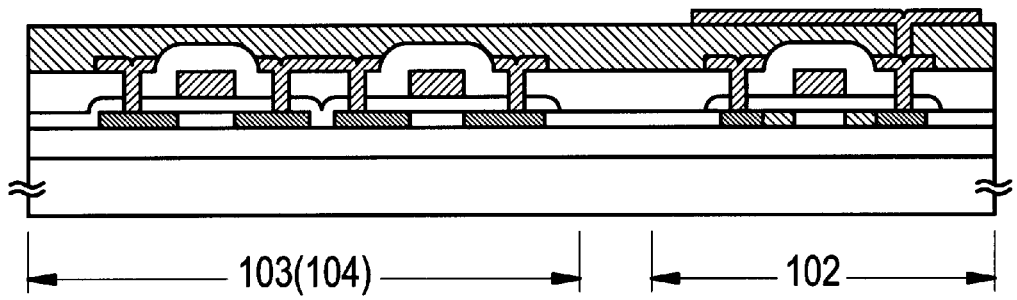
FIGS. 13A–13C and 14A–14B show a process of forming gap retaining members according to a fifth embodiment of the invention.

FIG. 13A shows the TFT substrate 100 that has been produced by the steps of the first embodiment. The configuration of FIG. 13A corresponds to that of FIG. 3B. Some reference numerals are omitted in FIG. 13A.

Figure 13B:
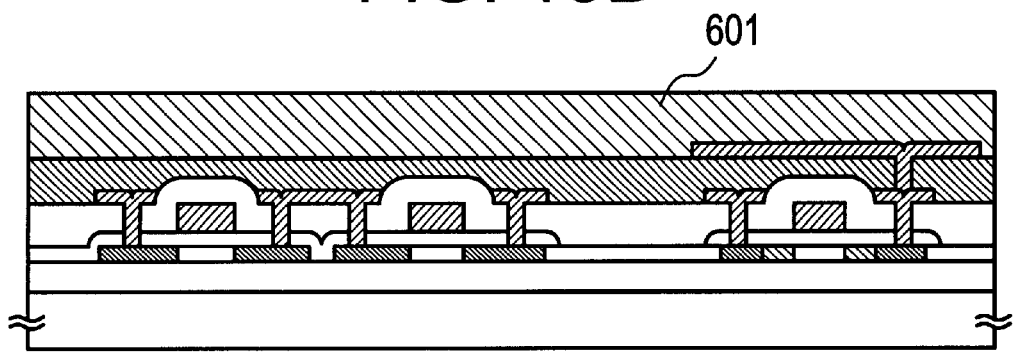
Figure 13C:
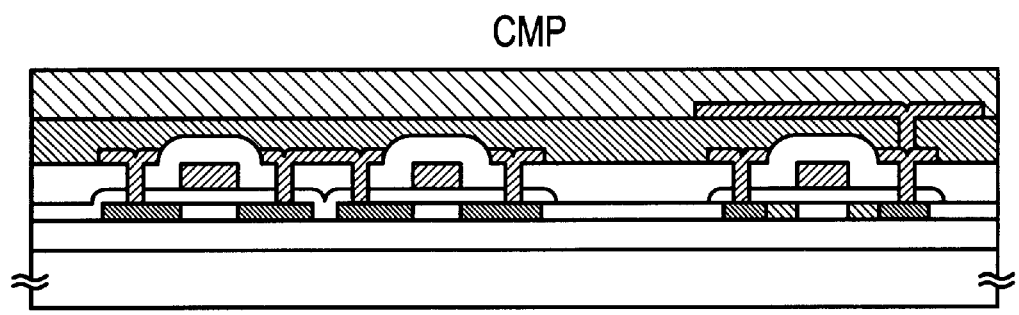

As shown in FIG. 13B, a 4.2-μm-thick photosensitive polyimide film 601 is formed by spin coating. Thereafter, the substrate is left at the room temperature for 30 minutes to uniformize the thickness of the photosensitive polyimide film 601 over the entire TFT substrate 100 (leveling). Then, the TFT substrate 100 on which the photosensitive polyimide film 601 is formed is pre-baked at 120° C. for 3 minutes.

Then, the top surface of the photosensitive polyimide film 601 is planarized by polishing it by CMP (chemical mechanical polishing). In this embodiment, slurry that is used in the CMP step is a colloid-like one in which a silica (SiO$_2$) fine powder is dispersed in an acid solution. As for the CMP conditions, each of the substrate and an abrasive cloth is rotated at 50 rpm and the polishing time is set at 3 minutes. The top surface of the photosensitive polyimide film 601 is planarized by the CMP step. The thickness of the planarize photosensitive polyimide film 601 was 3.2 μm. The CMP processing accuracy of the photosensitive polyimide film 601 was 0.1 μm.

Although in this embodiment the slurry that is used in the CMP step is one in which a silica fine powder is dispersed in an acid solution, slurry obtained by dispersing aluminum oxide (Al$_2$O$_3$), cerium oxide (CeO), or the like in an acid solution may also be used. It is desirable that the slurry be changed in accordance with the material that is subjected to CMP. Further, although in this embodiment CMP is performed for 3 minutes while each of the substrate and the abrasive cloth is rotated at 50 rpm, it is desirable that the optimum rotation speed and processing time be set for a material to be subjected to CMP.

The cell gap (interval between the substrates) is determined by the thickness of the photosensitive polyimide film 601 that has been subjected to CMP. Therefore, the thickness of the as-formed photosensitive polyimide film 601 may be set properly and the thickness to be reduced by CMP may be adjusted in accordance with the desired cell gap. In this manner, the desired cell gap can be obtained with high accuracy.

Although in this embodiment CMP is used in the step of polishing and planarizing the photosensitive polyimide film 601, this step may be executed by any method as long as the top surface of the photosensitive polyimide film 601 can be planarized with high accuracy. For example, etch back may also be used.

Figure 14A:
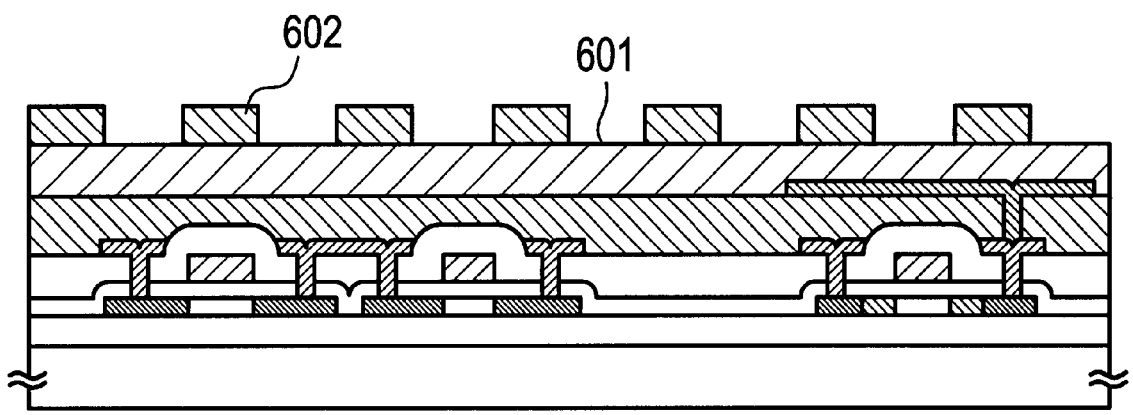
Figure 14B:
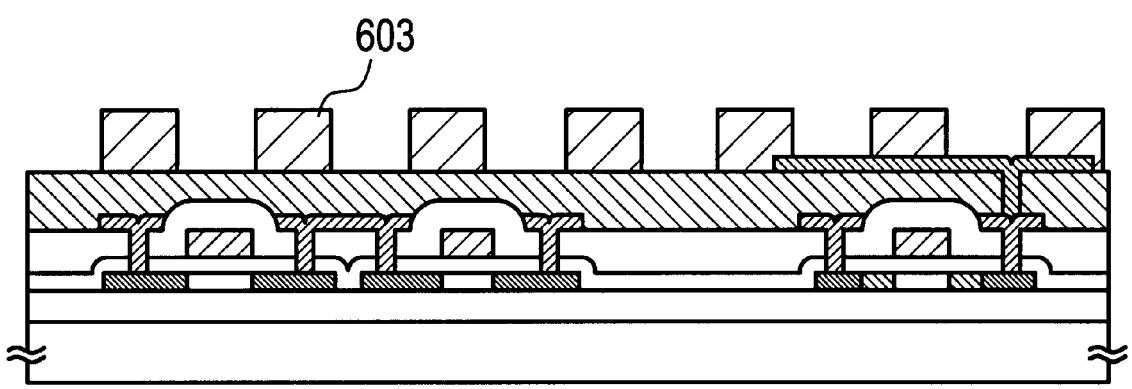

Then, the photosensitive polyimide film 601 is patterned. Specifically, as shown in FIG. 14A, after the photosensitive polyimide film 601 is covered with a photomask 602, ultraviolet light is applied to the TFT substrate 100 from above. Subsequently, development is performed and then post-baking is performed at 280° C. for one hour. As a result, patterned gap retaining members 603 are formed as shown in FIG. 14B. In this specification, the CMP-processed faces of the gap retaining members are called top faces.

Figure 15A:
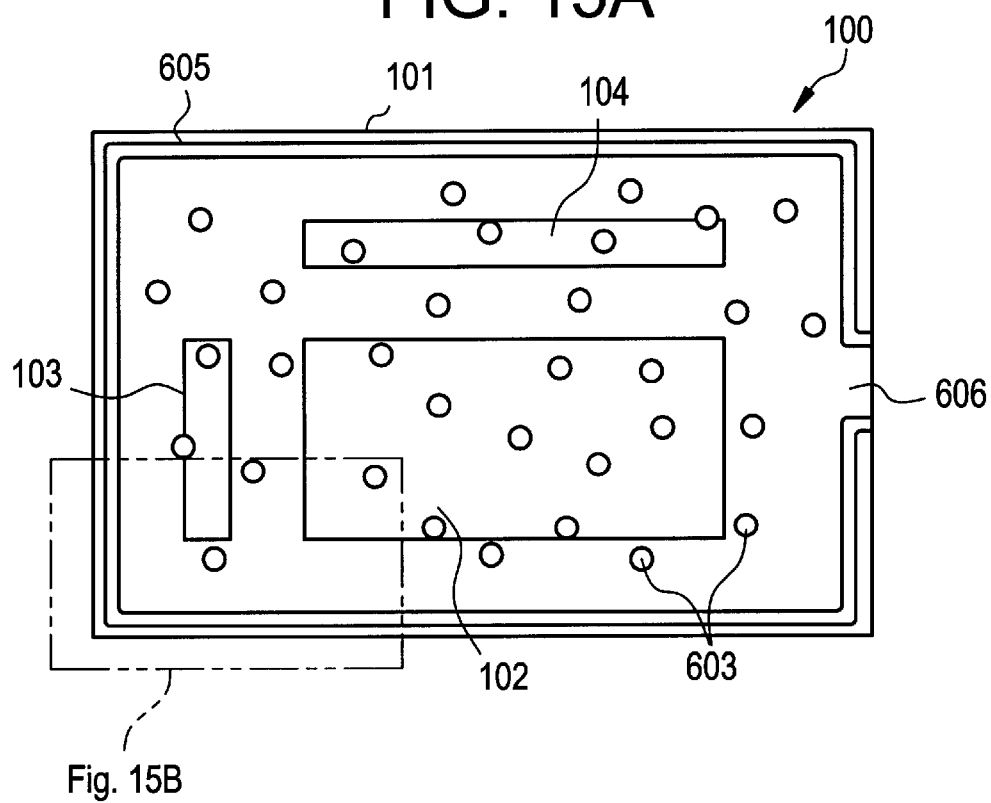
FIGS. 15A and 15B are a top view and an enlarged perspective view, respectively, of an active matrix liquid crystal display device according to the fifth embodiment.
Figure 15B:
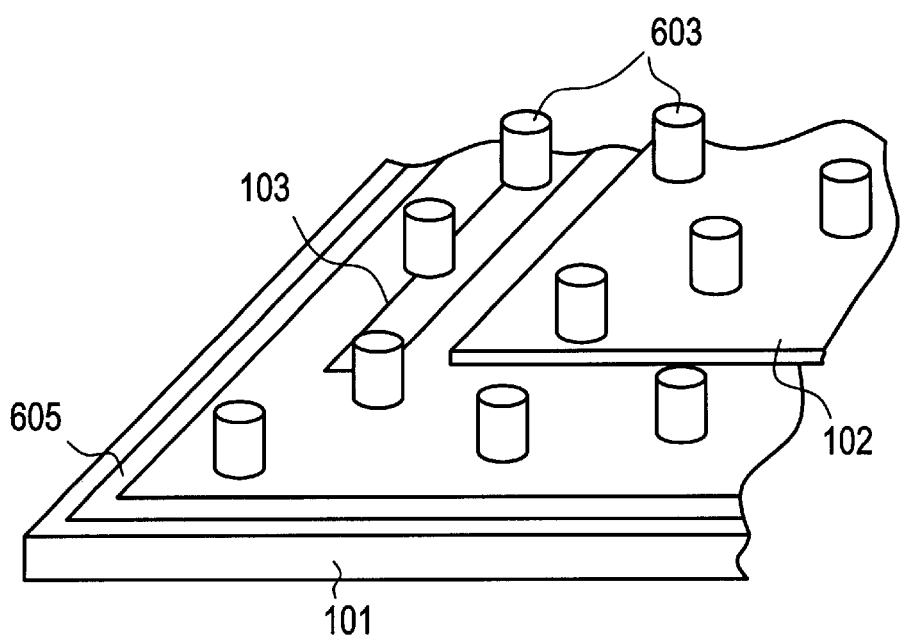

FIG. 15A is a top view of the TFT substrate 100 according to this embodiment. FIG. 15B is an enlarged perspective view of a part of FIG. 15A that is indicated by a two-dot chain line. In FIGS. 15A and 15B, for convenience, the scales of the gap retaining members 603, the pixel area 102, and the driver circuit areas 103 and 104 are different from each other. The components in FIGS. 15A and 15B that are given the same reference numerals as in FIGS. 1A and 1B are the same as the corresponding components in FIGS. 1A and 1B.

In this embodiment, as shown in FIGS. 15A and 15B, the gap retaining members 603 are shaped like a cylinder of 4 μm in diameter and 3.2 μm in height. In this embodiment, the gap retaining members 603 are arranged randomly. Their arrangement density may be set at 40–160 mm$^{-2}$. In this embodiment, it is set at 50 mm$^{-2}$.

Although in this embodiment the gap retaining members 603 are shaped like a cylinder, they may be shaped like an ellipse, a streamlined shape, or a polygon such as a triangle or a rectangle. The gap retaining members 603 may have any shape as long as they can control the gap between the TFT substrate (first substrate) 100 and the opposed substrate (second substrate) 200. Although in this embodiment all the gap retaining members 603 have the same shape, gap retaining members having plural kinds of shapes may be formed. Further, although in this embodiment the gap retaining members 603 are formed so that their arrangement density is uniform over the entire surface of the TFT substrate 100, the gap retaining members 603 may be arranged at a higher density in a certain region.

Then, an opposed substrate 200 in which an opposed electrode is formed is prepared (see FIG. 1B). In this embodiment, the opposed electrode that is formed in a pixel-confronting area 202 is made of ITO (indium tin oxide).

Then, alignment films (not shown) are formed on the TFT substrate 100 and the opposed substrate 200. Specifically, the TFT substrate 100 and the opposed substrate 200 are coated with 1,000-Å-thick, polyimide-type vertical alignment films by spin coating. Then, the alignment films are cured by baking in which a hot wind of 180° C. is fed.

Then, rubbing is performed in which the surface of the opposed substrate 200, i.e., the surface of the alignment film, is rubbed in one direction with a buff cloth (fiber of rayon, nylon, or the like) having hair lengths of 2–3 mm. In this embodiment, rubbing is not performed on the TFT substrate 100 side.

Thereafter, in this embodiment, a sealing agent 605 is applied to the opposed substrate 200 along its periphery so as to leave a liquid crystal injection inlet 606 (see FIG. 15A). The TFT substrate 100 and the opposed substrate 200 are then bonded together.

Then, a liquid crystal material as a display medium is injected through the liquid crystal injection inlet 606, whereby the liquid crystal material is held between the TFT substrate 100 and the opposed substrate 200. In this embodiment, since the gap retaining members 606 are shaped like a cylinder, the flow resistance that occurs between the liquid crystal material and the surfaces of the gap retaining members 603 in injecting the liquid crystal material is small. Therefore, the liquid crystal material can be injected uniformly over the entire substrate surfaces. It is preferable that the gap retaining members 603 be shaped and arranged so as to reduce the flow resistance.

Then, after a sealing agent (not shown) is applied to the liquid crystal injection inlet 606, the sealing agent is cured by illuminating it with ultraviolet light. The liquid crystal material is thus completely sealed in the cell.

When the display characteristics of cells actually manufactured in the above manner were checked, no interference fringe was observed on the cell surfaces. Further, superior display performance with no disclination was obtained.

Embodiment 6

This embodiment is different from the fifth embodiment in the area where gap retaining members are formed. This embodiment will be described with reference to FIG. 16. The components in FIG. 16 that are given the same reference numerals as in FIGS. 15A and 15B are the same as the corresponding components in FIGS. 15A and 15B. Reference numeral 610 denotes gap retaining members; 101, a substrate; 102, a pixel area; 103 and 104, driver circuit areas; 605, a sealing agent; and 606, a liquid crystal injection inlet.

Figure 16:
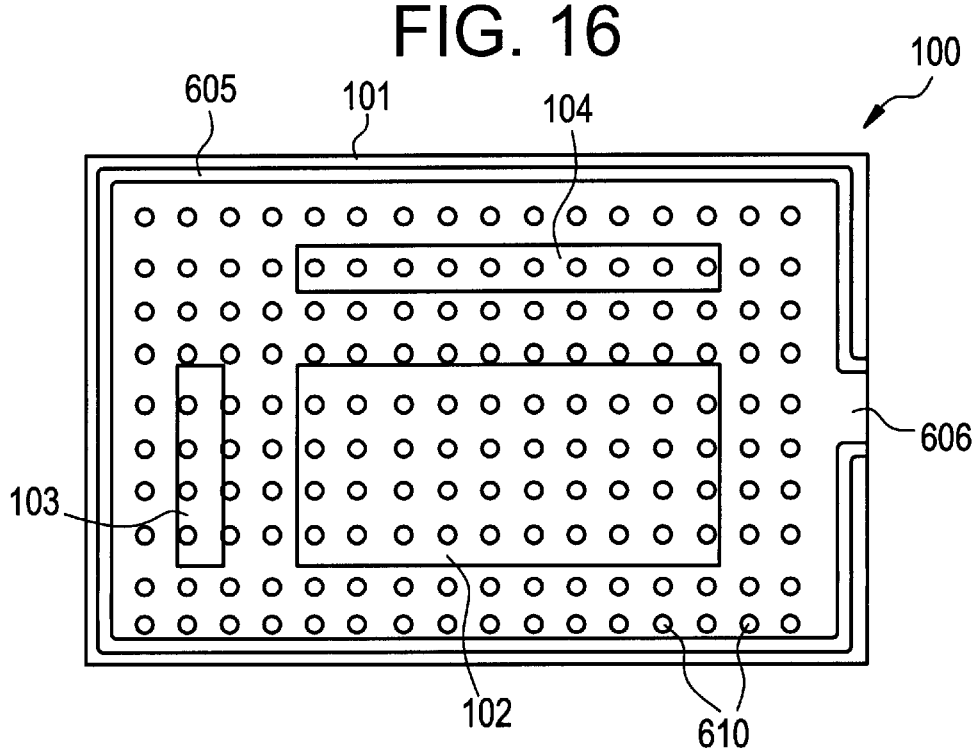
FIG. 16 is a top view of an active matrix liquid crystal display device according to a sixth embodiment of the invention.

In this embodiment, as shown in FIG. 16, the gap retaining members 610 are formed at regular intervals in the pixel area 102 and the driver circuit areas 103 and 104. It is preferable that in the pixel area 102 the gap retaining members 610 be formed in regions where signal lines and selection lines for the TFTs cross each other. The interval between the gap retaining members 610 in the pixel area 102 may be made different than in the driver circuit areas 103 and 104.

Embodiment 7

This embodiment is different from the second and fifth embodiments in the area where gap retaining members are formed. This embodiment will be described with reference to FIG. 17. The components in FIG. 17 that are given the same reference numerals as in FIGS. 15A and 15B are the same as the corresponding components in FIGS. 15A and 15B.

Figure 17:
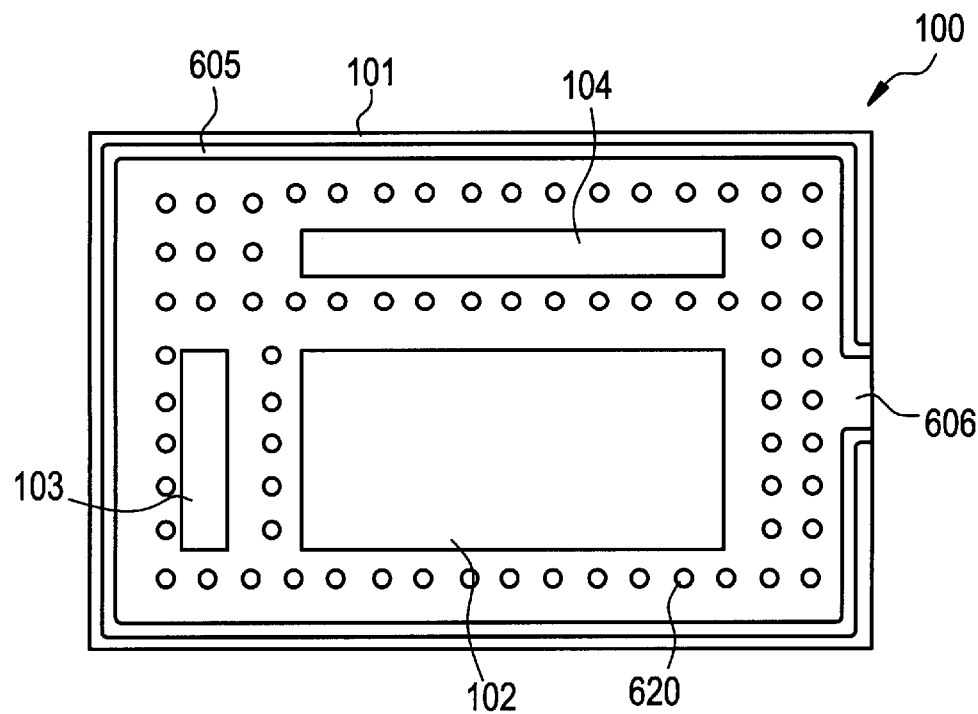
FIG. 17 is a top view of an active matrix liquid crystal display device according to a seventh embodiment of the invention.

In this embodiment, as shown in FIG. 17, gap retaining members 620 are formed in an area excluding the pixel area 102 and the driver circuit areas 103 and 104.

In this embodiment, since the gap retaining members 620 do not exist in the pixel area 102 nor the driver circuit areas 103 and 104, they do not decrease the effective aperture ratio as well as unnecessary stress is not exerted on the TFTs in the pixel area 102 and the driver circuit areas 103 and 104 in bonding the TFT substrate 100 and the opposed substrate 200 together. Therefore, the TFTs are not damaged and hence the yield of products will increase.

Embodiment 8

This embodiment is the same as the fifth, sixth, and seventh embodiment in the configuration of the TFT substrate 100 side, and is different from those embodiment in the configuration of the opposed substrate 200 side.

In an electro-optical device according to this embodiment, an organic resin film is formed after an opposed electrode is formed to constitute the opposed substrate 100. The organic resin film serves as a leveling film. In this embodiment, the organic resin film is made of polyimide. Other examples of the material of the organic resin film are acrylic, polyamide, and polyimideamide and the like.

Then, CMP is performed on the organic resin film in the same manner as in the fifth embodiment, whereby the organic resin film is leveled.

Thereafter, alignment films are formed on the TFT substrate 100 and the opposed substrate 200 and then rubbing is performed on the opposed substrate 200 side. The ensuing steps are the same as in the fifth embodiment.

In this embodiment, not only do the top faces of the gap retaining members provided on the TFT substrate 100 exist in the same plane but also the flatness of the top surface of the organic resin film provided on the opposed substrate 200 is secured. Therefore, the uniformity of the cell gap can even be improved. The opposed substrate 200 of this embodiment may be used in each of the first to fourth embodiments.

Embodiment 9

Although the first to eighth embodiments are directed to the case of using planar TFTs, naturally the invention is not limited by the TFT structure. Therefore, each TFT in the pixel area 102 and the driver circuit areas 103 and 104 may be an inverted staggered structure TFT or a multi-gate TFT.

Although in the first to eighth embodiments the gap retaining members are made of polyimide, other resins such as acrylic, polyamide, and polyimideamide may also be used. Further, the gap retaining members may be made of a thermosetting resin.

Although in the first to eighth embodiments the gap retaining members are formed on the TFT substrate 100, they may be formed on the opposed substrate 200 or both of them. Even in such cases the gap retaining members may be formed according to the method of the fifth embodiment.

Although in the first to eighth embodiments the gap retaining members are made of polyimide, they may be made of other insulative materials.

Although the first to eighth embodiments are directed to the reflection-type electro optical devices, transmission-type electro-optical devices may be formed by making some modifications such as using a transparent pixel electrode.

Although the first to eighth embodiments are directed to the case where a liquid crystal material is used as a display medium, the gap retaining members of the invention can also be with a mixed layer of a liquid crystal material and a polymer, that is, they can be used in a polymer dispersion type liquid crystal display device. Further, the electro-optical devices of the invention may use any other display media whose optical characteristic is modulated in response to the application voltage, such as an electroluminescence element.

Although in the first to eighth embodiments no particular reference is made to color display, color filters may be provided on the opposed substrate 200 side when color display is needed. The color filters are required to be uniform in thickness, i.e., flat, and superior in both heat resistance and resistance to chemicals.

Although in the first to eighth embodiments rubbing is performed on only the opposed substrate 200 side, rubbing may be performed on the TFT substrate 100 side or both substrates.

Although the first to eighth embodiments are directed to the active matrix electro-optical devices, it goes without saying that the invention can be applied to passive electro-optical devices that have no active elements such as TFTs.

Embodiment 10

Figure 18:
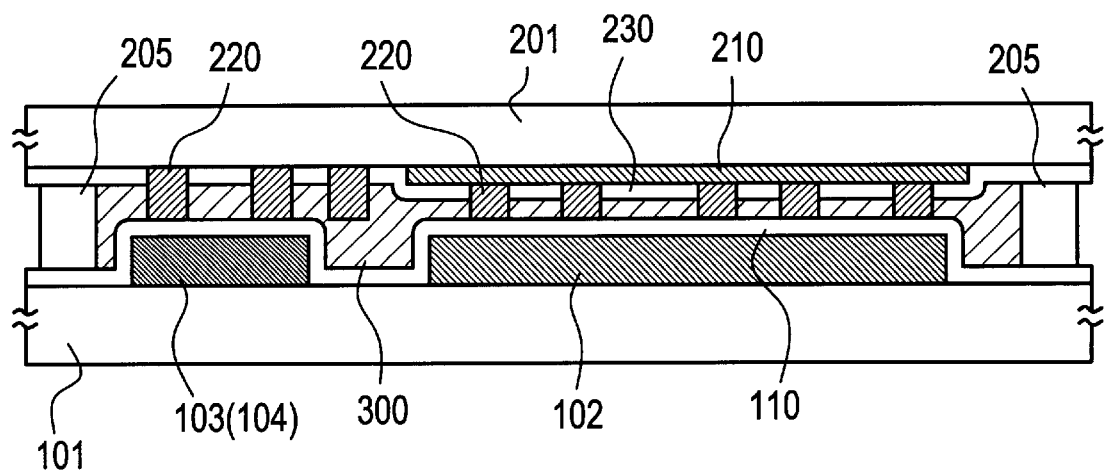
FIG. 18 is a schematic sectional view of a liquid crystal display device according to a tenth embodiment of the invention.

This embodiment will be described with reference to FIG. 18 to FIGS. 21A and 21B. This embodiment is directed to a case where the invention is applied to an active matrix liquid crystal display device and gap retaining members are formed on only the opposed substrate 200. FIG. 18 is a schematic sectional view of a liquid crystal display device. The components in FIG. 18 that are given the same reference numerals as in FIGS. 1A and 1B are the same components as in FIGS. 1A and 1B.

As shown in FIG. 18, a TFT substrate 100 and an opposed substrate 200 are bonded together with a sealing agent 205 that is provided on a peripheral portion of a substrate 201. The opposed substrate 200 is provided with an opposed electrode 210 that confronts a pixel area 102 and gap retaining members 220 for retaining the gap between the TFT substrate 100 and the opposed substrate 200.

A liquid crystal 300 is injected into the space between the TFT substrate 100 and the opposed substrate 200 through a liquid crystal injection inlet 206 and then sealed with a sealing agent 205. The TFT substrate 100 and the opposed substrate 200 are provided with alignment films 110 and 230 for giving proper alignment to the liquid crystal 300, respectively.

First, the TFT substrate 100 is produced according to the manufacturing method of the TFT substrate 100 described in the first embodiment (see FIGS. 2A–2E and 3A–3B). In the pixel area 102 of the TFT substrate 100 shown in FIG. 19, at least one TFT is provided for and electrically connected to each pixel electrode. Examples of driver circuits formed in the driver circuit areas 103 and 104 are a shift register and an address decoder. Other circuits may also be formed when necessary.

Figure 19:
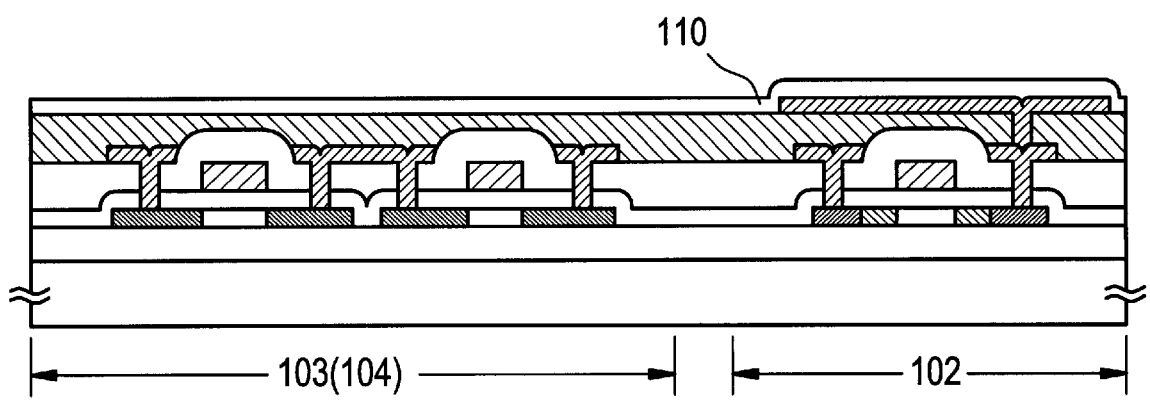
FIG. 19 is a sectional view of a TFT substrate according to the tenth embodiment.

After the configuration of FIG. 3B is obtained, the TFT substrate 100 is cleaned sufficiently to remove various chemicals such as etching liquids and resist removers that were used for the surface processing in forming the TFTs. Then, an alignment film 110 is formed on the TFT substrate 100 as shown in FIG. 19 according to a method described later.

Figure 20A:
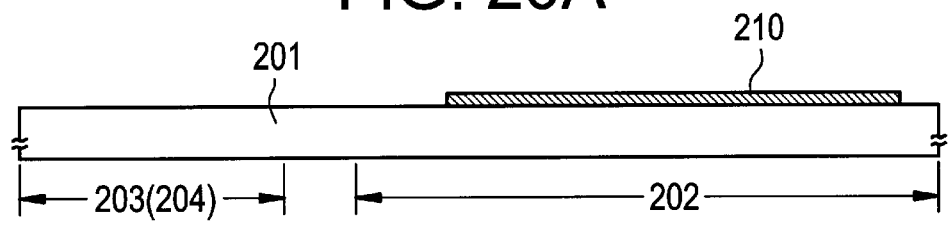
FIGS. 20A–20E show a manufacturing process of an opposed substrate according to the tenth embodiment.

Next, a manufacturing process of the opposed substrate 200 will be described with reference to FIGS. 20A–20E. As shown in FIG. 20A, a transparent glass or quartz substrate is used as a substrate 201. In this embodiment, a glass substrate is used. A transparent conductive film is formed on the glass substrate 201 and then patterned into an opposed electrode 210 in an area 202 to confront the pixel area 102 (see FIG. 20A). In this embodiment, a 150-nm-thick ITO film is formed as the transparent conductive film.

If necessary, color filters and a black matrix are formed by a known method such as dyeing or printing before the formation of the opposed electrode 210. The color filters are required to be uniform in thickness, i.e., flat, and superior in both heat resistance and resistance to chemicals.

Next, a process of forming the gap retaining members 220 will be described. In this embodiment, the gap retaining members 220 are formed by using polyimide which is one of photosensitive resin materials.

Figure 20B:
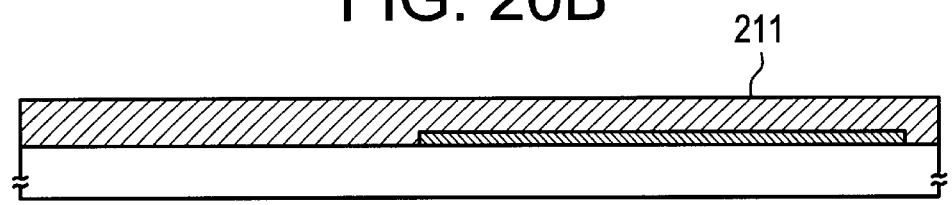

First, as shown in FIG. 20B, a 3.2-$\mu$m-thick photosensitive polyimide film 211 is formed by spin coating. Thereafter, the substrate is left at the room temperature for 30 minutes to uniformize the thickness of the photosensitive polyimide film 211 over the entire opposed substrate 200 (leveling). Then, the opposed substrate 200 on which the photosensitive polyimide film 211 is formed is pre-baked at 120° C. for 3 minutes.

Since the thickness of the photosensitive polyimide film 211 determines the cell gap (interval between the substrates), it may be set properly in accordance with the desired cell gap. For example, the thickness of the photosensitive polyimide film 211 may be determined so that the cell gas becomes about 4–6 $\mu$m for a transmission-type liquid crystal display device, about 2–3 $\mu$m for a reflection-type liquid crystal display device, and less than 2 $\mu$m for a ferroelectric liquid crystal display device. Since the liquid crystal display device of this embodiment is of a reflection type, the thickness of the photosensitive polyimide film 211 is set at 3.2 $\mu$m.

Figure 20C:
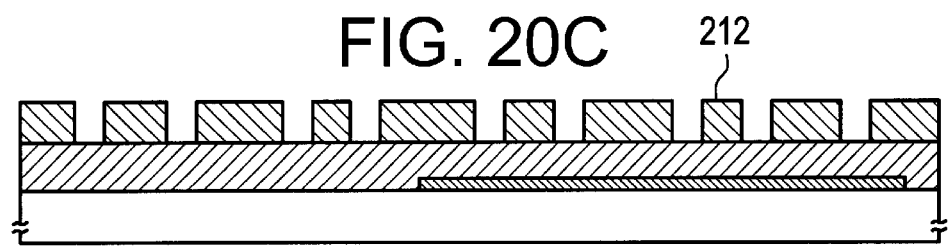

Then, the photosensitive polyimide film 211 is patterned. Specifically, after the photosensitive polyimide film 211 is covered with a photomask 212 as shown in FIG. 20C, ultraviolet light is applied from the mask 212 side. Subsequently, development is performed and then post-baking is performed at 280° C. for one hour. Patterned gap retaining members 220 are thus formed as shown in FIG. 20D.

Figure 20D:
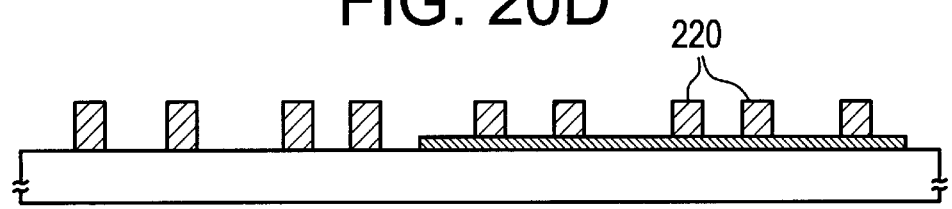
Figure 21A:
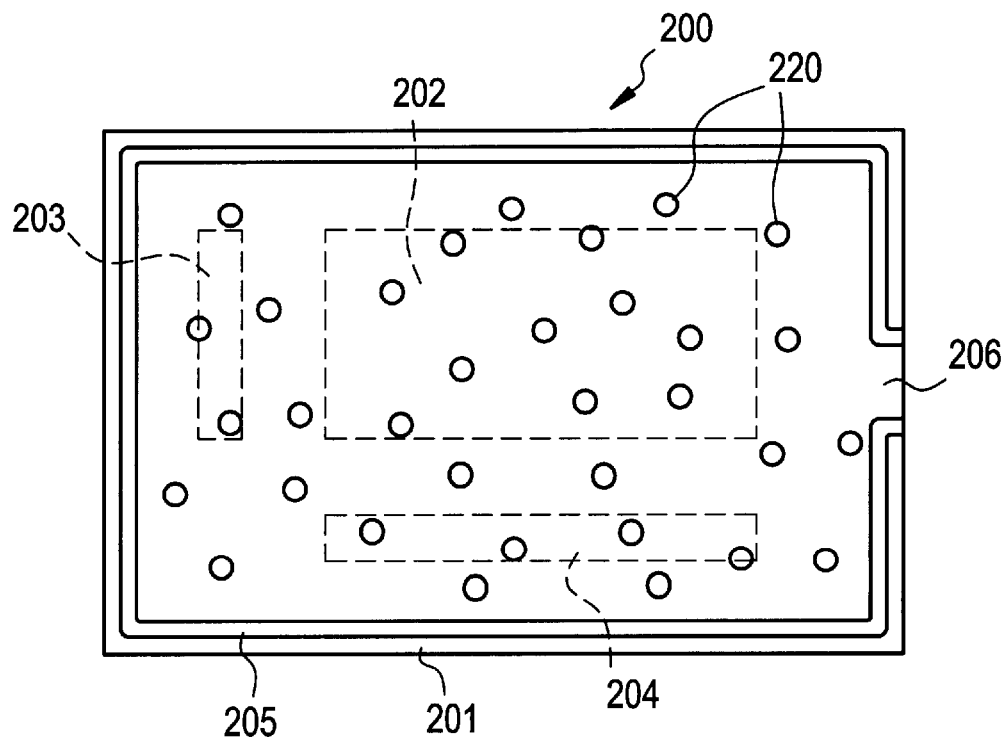
FIGS. 21A and 21B are a top view and an enlarged perspective view of the opposed substrate according to the tenth embodiment.
Figure 21B:
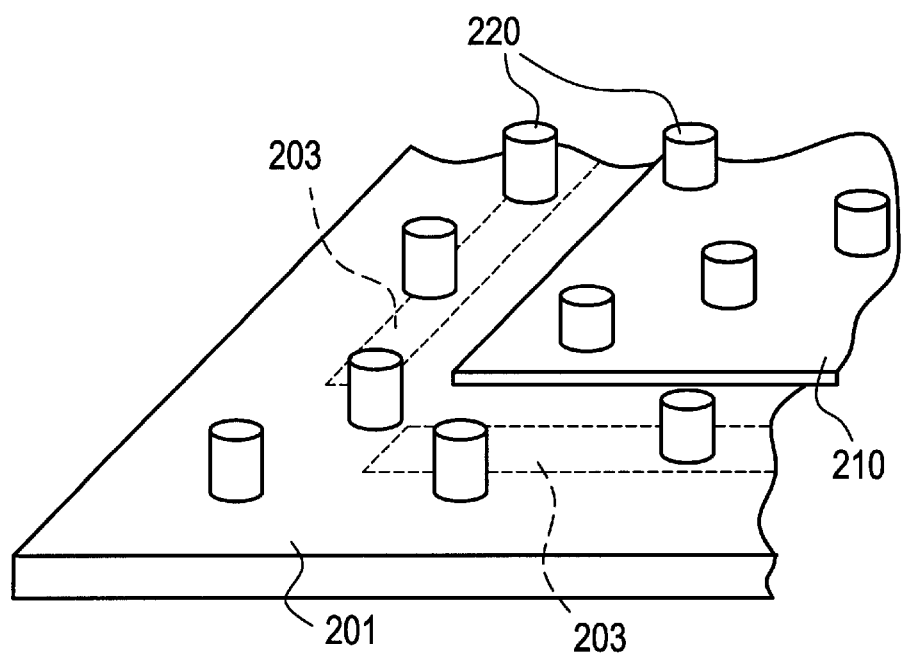

FIGS. 21A and 21B are a top view and an enlarged perspective view, respectively, of the opposed substrate 200 in the state of FIG. 20D. As shown in FIGS. 21A and 21B, the gap retaining members 220 are shaped like a cylinder and replace the conventional spherical spacers. Therefore, the cylinder diameter and height of the gap retaining members 220 may be set at 1.5–2.5 $\mu$m and 2.0–5.0 $\mu$m, respectively. In this embodiment, the cylinder diameter is set at 3.0 $\mu$m and, to provide a cell gap of 3.0 $\mu$m, the cylinder height is set at 3.2 $\mu$m in the pixel-confronting area 202. The height of the gap retaining members 220 in driver-circuit-confronting areas 203 and 204 is made greater than in the pixel-confronting area 202 by the total thickness of the opposed electrode 210, the color filters, etc.

In this embodiment, the gap retaining members 220 are arranged randomly so as to function in the same manner as the conventional spherical spacers. Therefore, the density of the gap retaining members 220 may be set approximately equal to that of the conventional spherical spacers, i.e., about 40–160 mm$^{-2}$. In this embodiment, the gap retaining members 220 are arranged randomly at a density of 50 mm$^{-2}$. Since the gap retaining members 220 are arranged randomly over the entire opposed substrate 200, the positional accuracy of the gap retaining members 220 is not very important, which means a large production margin.

Figure 20E:
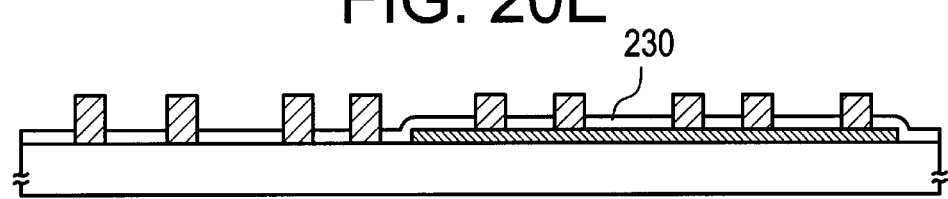

Then, alignment films 110 and 230 are formed on the TFT substrate 100 and the opposed substrate 200, respectively (see FIGS. 19 and 20E). The alignment films 110 and 230 are vertical alignment type polyimide films. The thickness of the alignment films 110 and 230 may be set at about 60–100 nm.

Specifically, after the TFT substrate 100 and the opposed substrate 200 are cleaned, they are coated with respective polyimide-type vertical alignment films by one of spin coating, flexography, and screen printing. In this embodiment, polyimide films are applied by spin coating. Then, the polyimide films are cured by performing preliminary baking at 80° C. for 5 minutes and then performing main baking by feeding a hot wind of 180° C. The alignment films 110 and 230 are thus formed at a thickness of 80 nm.

In FIG. 20E, the alignment film 230 is drawn so as not to cover the side faces and the top faces of the gap retaining members 220. In this embodiment, since the polyimide film is formed by spin coating, there may occur a case that the polyimide film covers the side faces and the top faces of part of the gap retaining members 220. Since the polyimide film (thickness: tens to hundreds of nanometers) is much thinner than the gap retaining members 220 (height: several micrometers) and it may not assume a complete film on vertical surfaces such as the side faces of the gap retaining members 220, in FIG. 20E the alignment film 230 is shown so as to be formed on only the horizontal surface.

Although in this embodiment the alignment films 110 and 230 are made of polyimide, other resins such as acrylic, polyamide, and polyimideamide may also be used. Further, they may be made of a thermosetting resin.

Then, rubbing is performed in which each of the surface of the alignment film 110 on the TFT substrate 100 and the surface of the alignment film 230 on the opposed substrate 200 is rubbed in one direction with a buff cloth (fiber of rayon, nylon, or the like) having hair lengths of 2–3 mm. A TN mode alignment operation is performed in which the rubbing directions for the TFT substrate 100 and the opposed substrate 200 are perpendicular to each other.

In rubbing the TFT substrate 100, electrostatic breakdown of the TFTs formed in the TFT substrate 100 is prevented by preventing generation of static electricity by using an ion blow apparatus or a humidifier.

On the other hand, in rubbing the opposed substrate 200, the kind and the hair planting density of the buff cloth and the rubbing conditions such as the roller rotation speed are selected or set so as not to destroy the gal retaining members 220.

Then, an ultraviolet curable resin as a sealing agent 205 is applied to a peripheral portion of the opposed substrate 200 so as to leave a liquid crystal injection inlet 206 (see FIG. 21A). Subsequently, the TFT substrate 100 and the opposed substrate 200 are opposed to each other and then pressed against each other so that the cell gap in the pixel area 102 comes equal to the height of the gap retaining members 220. The sealing agent 205 is cured in this state. The sealing agent 205 may be applied to the TFT substrate 100 side.

Then, a liquid crystal material 300 as a display medium is injected through the liquid crystal injection inlet 206, whereby the liquid crystal material is held between the TFT substrate 100 and the opposed substrate 200. After a sealing agent is applied to the liquid crystal injection inlet 206, the sealing agent is cured by illuminating it with ultraviolet light. The liquid crystal material 300 is thus completely sealed in the cell.

The configuration of FIG. 18 is obtained by the above steps.

Although in this embodiment the gap retaining members 220 are shaped like a cylinder, they may be shaped like an ellipse, a streamlined shape, or a polygon such as a triangle or a rectangle. The gap retaining members 220 may have any shape as long as they can control the gap between the TFT substrate (first substrate) 100 and the opposed substrate (second substrate) 200.

Although this embodiment is directed to the reflection-type liquid crystal display device in which the pixel electrodes are made of a metal material, a transmission-type liquid crystal display device may also be configured because the TN mode type alignment operation is performed. In such a case, the pixel electrodes may be transparent conductive films of ITO, $SnO_2$, or the like. Further, although this embodiment is of the TN mode type, other modes may also be employed; the rubbing may be performed in accordance with the mode.

Although this embodiment is directed to the case of using planar TFTs, naturally the invention is not limited by the TFT structure. Therefore, each TFT in the pixel area 102 and the driver circuit areas 103 and 104 may be an inverted staggered structure TFT or a multi-gate TFT. Further, this embodiment can be applied to an IPS-type liquid crystal panel in which also the opposed electrode is formed on the TFT substrate.

In this embodiment, since the gap retaining members 220 are made of a photosensitive resin material, their height can be set as desired, for instance, at less than 2 $\mu$m. Therefore, the cell gap of the liquid crystal display device can be made less than 2 $\mu$m. Therefore, the gap retaining members 220 of this embodiment are suitable for use in a liquid crystal panel of a ferroelectric liquid crystal display device or that of a projection-type liquid crystal display device.

Further, in this embodiment, since the gap retaining members 220 are fixed to the opposed substrate 200, they are not gathered due to the flow of a liquid crystal, unlike the conventional spacers. Therefore, point defects due to gathering of spacers can be prevented.

Embodiment 11

Although in the tenth embodiment rubbing is performed on both of the TFT substrate 100 side and the opposed substrate 200 side. In this embodiment, rubbing is performed on only the alignment film 110 formed on the TFT substrate 100. The other part of the manufacturing process of this embodiment is the same as in the tenth embodiment.

Since a buff cloth that is used in the rubbing step is a source of static electricity and dust, the yield of the liquid crystal display device strongly depends on the rubbing step. In this embodiment, to reduce the number of rubbing operations, rubbing is performed on only the TFT substrate 100 side.

As for the opposed substrate 200, the height of the gap retaining members 220 is several micrometers and the thickness of the alignment film 230 is tens to hundreds of nanometers, and hence the gap retaining members 220 project to the liquid crystal side. Therefore, there is a possibility that the rubbing with the buff cloth damages or peels the gap retaining members 220. In such a case, the thickness of the gap retaining members 220 vary, making it difficult to keep the cell gap uniform over the entire substrate or among substrates. Further, damaged or peeled gap retaining members 220 become a new source of dust.

Further, since the gap retaining members 220 project to the liquid crystal side, it is difficult to form grooves in the alignment film 230 in the intended manner, leaving a possibility that the liquid crystal 300 will not be given proper alignment. Since display cannot be performed if the liquid crystal 300 is not oriented properly, properly orienting the liquid crystal 300 is an important factor in increasing the production yield.

To avoid the above problems, in this embodiment, rubbing is performed on only the alignment film 110 formed on the TFT substrate 100.

In this embodiment, as in the tenth embodiment, the alignment films 110 and 230 are vertical alignment type polyimide films. Rubbing is performed in such a manner that the surface of alignment film 110 formed on the TFT substrate 100 is rubbed in a predetermined direction with a buff cloth (fiber of rayon, nylon, or the like) having hair lengths of 2–3 mm. To prevent a reduction in the production yield of the TFT substrate 100, it is important that a proper measure be taken to prevent generation of static electricity in the step of rubbing the TFT substrate 100.

Embodiment 12

While in the eleventh embodiment rubbing is performed on only the TFT substrate 100 side, in this embodiment rubbing is performed on only the alignment film 230 formed on the opposed substrate 200. The other part of the manufacturing process of this embodiment is the same as in the tenth embodiment (see FIG. 18).

Since a buff cloth that is used in the rubbing step is a source of static electricity and dust, the yield of the liquid crystal display device strongly depends on the rubbing step. In this embodiment, to reduce the number of rubbing operations, rubbing is performed on only the opposed substrate 200 side.

The buff cloth used in the rubbing step causes static electricity and dust, which may destroy the TFTs that are formed in the TFT substrate 100. More steps are needed to produce the TFT substrate 100 than to produce the opposed substrate 200. Therefore, frequent occurrence of defects in TFT substrates 100 increases the manufacturing cost of the liquid crystal display device. This embodiment is intended to increase the production yield of the TFT substrate 100 by refraining from rubbing the TFT substrate 100 side.

In this embodiment, as in the tenth embodiment, the alignment films 110 and 230 are vertical alignment type polyimide films. Rubbing is performed in such a manner that the surface of alignment film 230 formed on the opposed substrate 200 is rubbed in a predetermined direction with a buff cloth (fiber of rayon, nylon, or the like) having hair lengths of 2–3 mm. The rubbing conditions are set so as not to damage or peel the gap retaining members 220 formed on the opposed substrate 200.

Although the eleventh and twelfth embodiments are the same in that rubbing is performed on only one substrate side, they have different effects. A party who practice the invention may select a substrate to be subjected to rubbing in consideration of the manufacturing cost, the yield, and other factors.

Where rubbing is performed on only one of the alignment films as in the case of the eleventh and twelfth embodiments, available liquid crystal driving modes are restricted. However, the inventors have confirmed that the birefringence (ECB) mode is available.

On the other hand, where rubbing is performed on both alignment films as in the case of the tenth embodiment, there are advantages that available liquid crystal driving modes are not restricted and the liquid crystal can be oriented reliably though rubbing operations need to be performed one time more than in the eleventh and twelfth embodiments. Where the invention is applied to a polymer dispersion type liquid crystal display device, no alignment film rubbing operation is necessary.

Embodiment 13

Figure 22:
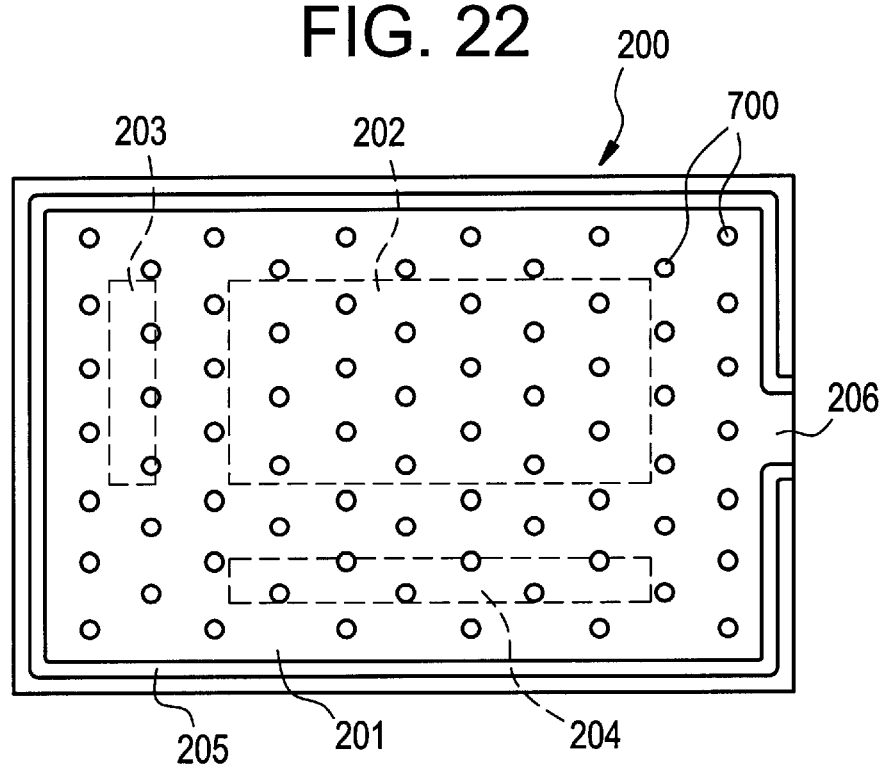
FIG. 22 is a top view of an opposed substrate according to a thirteenth embodiment of the invention.

This embodiment is directed to modification to the arrangement of the gap retaining members and is the same as the tenth embodiment in the other points. FIG. 22 is a top view of an opposed substrate according to this embodiment. The members in FIG. 22 that are given the same reference numerals as in FIGS. 21A and 21B are the same as the corresponding members in FIGS. 21A and 21B.

In the tenth embodiment, the gap retaining members 220 are arranged randomly on the entire opposed substrate 200 as shown in FIG. 21A. In contrast, in this embodiment, as shown in FIG. 22, gap retaining members 700 are arranged regularly in matrix form. The shape of the gap retaining members 700 are the same as in the tenth embodiment, that is, they are shaped like a cylinder of 2.0 μm in diameter and 3.2 μm in height. Also as in the case of the tenth embodiment, the gap retaining members 700 are arranged at a density of 50 mm$^{-2}$.

The gap retaining members 700 of this embodiment provides the same advantages as the gap retaining members 220 of the tenth embodiment.

Embodiment 14

Figure 23:
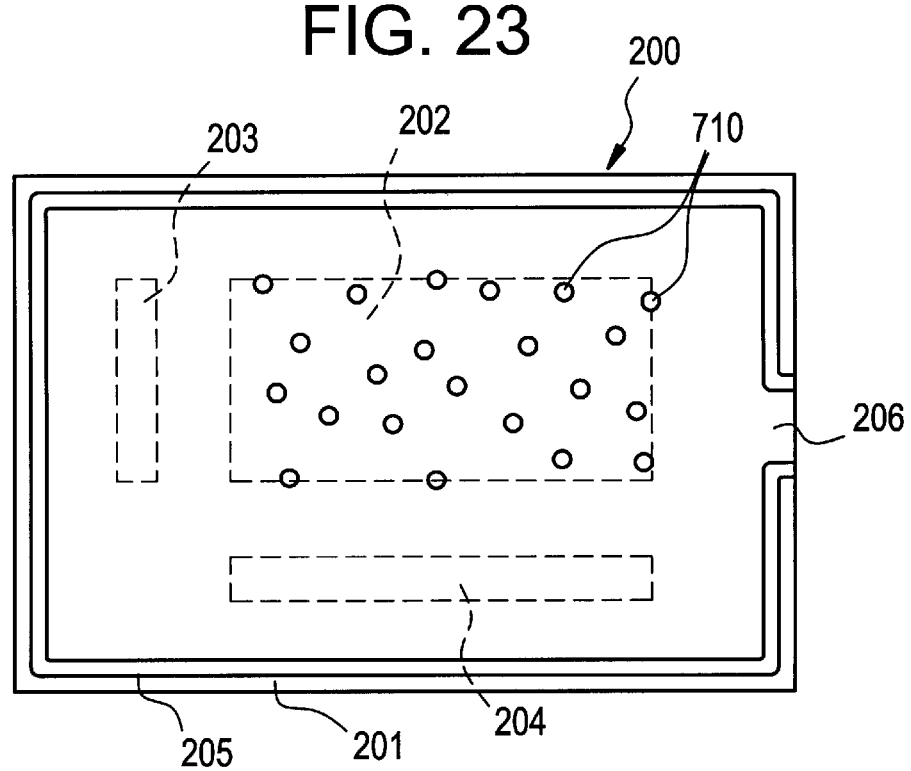
FIG. 23 is a top view of an opposed substrate according to a fourteenth embodiment of the invention.

This embodiment is directed to modification to the arrangement of the gap retaining members and is the same as the tenth embodiment in the other points. FIG. 23 is a top view of an opposed substrate according to this embodiment. The members in FIG. 23 that are given the same reference numerals as in FIGS. 21A and 21B are the same as the corresponding members in FIGS. 21A and 21B.

In the tenth embodiment, the gap retaining members 220 are arranged randomly on the entire opposed substrate 200 as shown in FIG. 21A. In contrast, in this embodiment, as shown in FIG. 23, gap retaining members 710 are arranged randomly in the pixel-confronting area 202 so as not to be formed in the driver-circuit-confronting areas 203 and 204. The shape of the gap retaining members 710 are the same as in the tenth embodiment, that is, they are shaped like a cylinder of 2.0 μm in diameter and 3.2 μm in height. The gap retaining members 710 are arranged at a density of 60 mm$^{-2}$.

Since the TFTs in the driver circuit areas 103 and 104 have a higher integration density than the TFTs in the pixel area 102, they are prone to be broken by stress that is imposed by the spacers. In this embodiment, since no gap retaining members 710 are formed in the driver-circuit-confronting areas 203 and 204, when the TFT substrate 100 and the opposed substrate 200 are bonded together the gap retaining members 710 do not exert stress on the driver circuits formed in the TFT substrate 100. Therefore, the yield of the driver circuits can be increased.

In FIG. 23, there are gap retaining members 710 that partially exist outside the pixel-confronting area 202. This embodiment only requires that the gap retaining members 710 can retain the gap in the pixel area 202, and that the gap retaining members 710 not be formed in the driver-circuit-confronting areas 203 and 204.

In the tenth and thirteenth embodiments, the gap retaining members 220 are formed in the pixel-confronting area 202 and disclination is prone to occur around the gap retaining members 220. Therefore, where the gap retaining members 220 are formed in the pixel-confronting area 202, to prevent display defects, it is preferable that the gap retaining members 220 be formed in regions that do not contribute to the display, for instance, regions where a black matrix or bus lines of the TFT substrate 100 are formed.

Embodiment 15

Figure 24A:
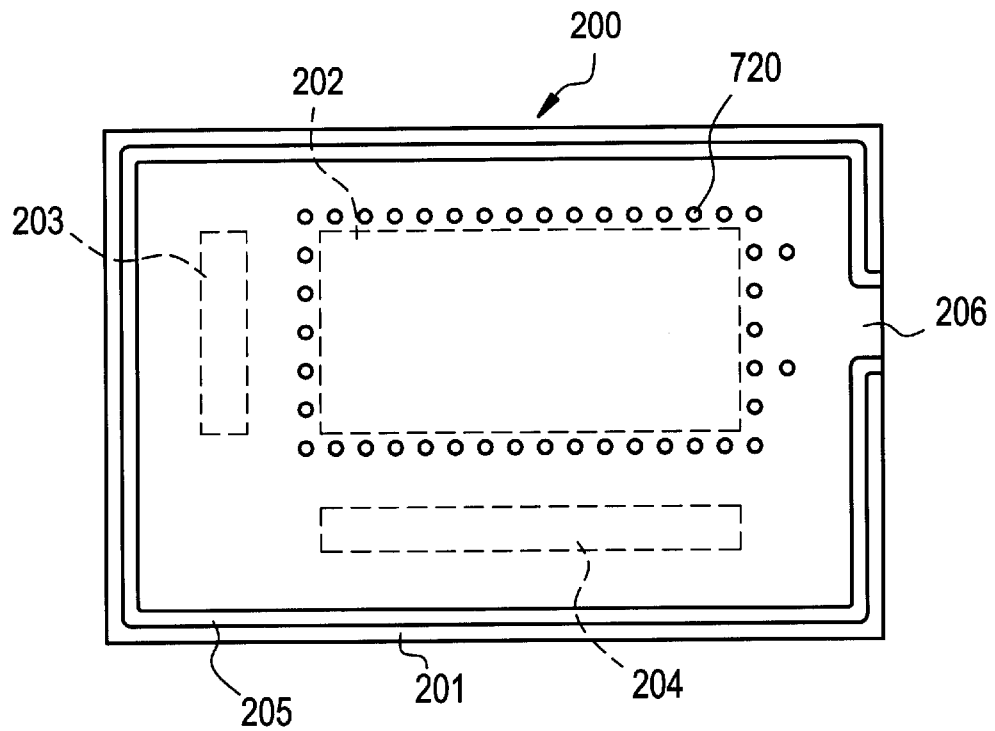
FIGS. 24A and 24B are top views of opposed substrates according to a fifteenth embodiment of the invention.
Figure 24B:
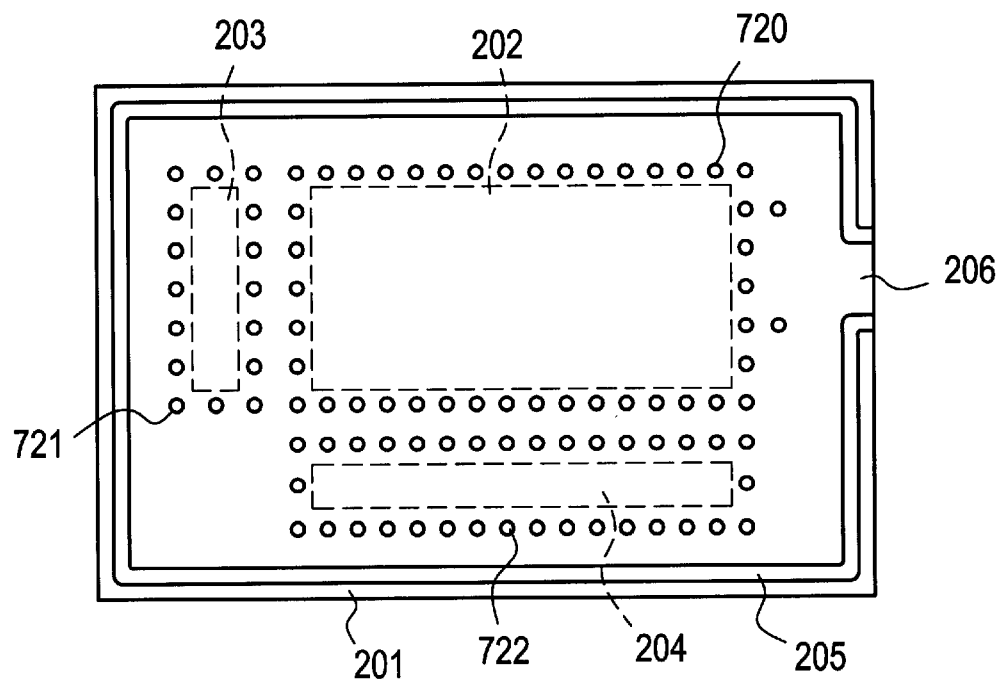

This embodiment is directed to modification to the arrangement of the gap retaining members and is the same as the tenth embodiment in the other points. FIGS. 24A and 24B are top views of opposed substrates according to this embodiment. The members in FIGS. 24A and 24B that are given the same reference numerals as in FIGS. 21A and 21B are the same as the corresponding members in FIGS. 21A and 21B.

While in the fourteenth embodiment the gap retaining members 710 are not formed in the driver-circuit-confronting areas 203 and 204, in this embodiment gap retaining members are not formed in the driver-circuit-confronting areas 203 and 204 nor the pixel-confronting area 202.

There are a height difference between the pixel-confronting area 202 and the driver circuit-confronting areas 203 and 204; in general, the height is greater in the pixel-confronting area 202. However, in the tenth embodiment, the height of the gap retaining members 220 from the substrate 201 to their top faces is made uniform over the entire opposed substrate 200. Therefore, as the height difference between the pixel-confronting area 202 and the driver-circuit-confronting areas 203 and 204 increases, it becomes more difficult to compensate for the height difference and a cell gap variation becomes more prone to occur in bonding the substrates 100 and 200 together.

In the tenth and thirteenth embodiments, since the gap retaining members 220 or 700 are formed on the entire opposed substrate 200, there is a possibility that gap retaining members 220 or 700 damage the TFTs that are formed in the pixel area 202 and the driver circuit areas 103 and 104.

This embodiment is directed to a method of forming gap retaining members that solves the above problems, that is, prevents a cell gap variation as well as prevents the TFTs that are formed in the TFT substrate 100 from being damaged.

FIGS. 24A and 24B are top views of opposed substrates 200 according to this embodiment. The opposed substrates 200 are produced in the same manner as in the tenth embodiment.

In this embodiment, as shown in FIG. 24A, cylindrical gap retaining members 720 are arranged so as to surround the pixel-confronting area 202. Specifically, the gap retaining members 720 are shaped like a cylinder of 10 μm in diameter and 3.2 μm in height. The gap retaining members 720 are located so as to be separated by 70 μm from the end of the pixel area 102 of the TFT substrate 100 in the state that the substrates 100 and 200 are bonded together. The interval between the gap retaining members 720 are set at 30 μm. The arrangement density of the gap retaining members 720 in the vicinity of a liquid crystal injection inlet 206 is made lower than in the other portions to facilitate the flow of a liquid crystal.

The intervals between the pixel-confronting area 202 and the driver-circuit-confronting areas 203 and 204 are hundreds of micrometers, which is sufficiently longer than the diameter of the gap retaining members 720. Therefore, the manufacturing margin of the positions of the gap retaining members 720 is as large as about ±10 μm. On the other hand, the accuracy of the height of the gap retaining members 720 is an important factor in determining the cell gap, and is set at about ±0.1 μm in this embodiment.

While in FIG. 24A the gap retaining members 720 are formed only around the pixel-confronting area 202, gap retaining members 721 and 722 may additionally be formed around the driver-circuit-confronting areas 203 and 204 as shown in FIG. 24B.

In this embodiment, the gap retaining members 720 are formed in the regions that do not overlap with the pixel area 102 nor the driver circuit areas 103 and 104 when the substrates 100 and 200 are bonded together. Therefore, the cell gap is determined by only the height of the gap retaining members 720 (and 721 and 722). Therefore, even if there is a height difference between the pixel area 102 and the driver circuit areas 103 and 104, the cell gas can be made uniform over the entire substrate or among different substrates.

Further, since the gap retaining members 720 do not press the pixel TFTs nor the driver circuit TFTs formed in the TFT substrate 100, the yield can be increased.

Although in this embodiment the gap retaining members 720 (and 721 and 722) are formed around the pixel-confronting area 202 (and the driver-circuit-confronting areas 203 and 204), the positions of the gap retaining members are not limited to those shown in FIGS. 24A and 24B. The gap retaining members may be formed anywhere except the pixel-confronting area 202 and the driver-circuit-confronting areas 203 and 204 as long as they can retain the cell gap.

Embodiment 16

Figure 25A:
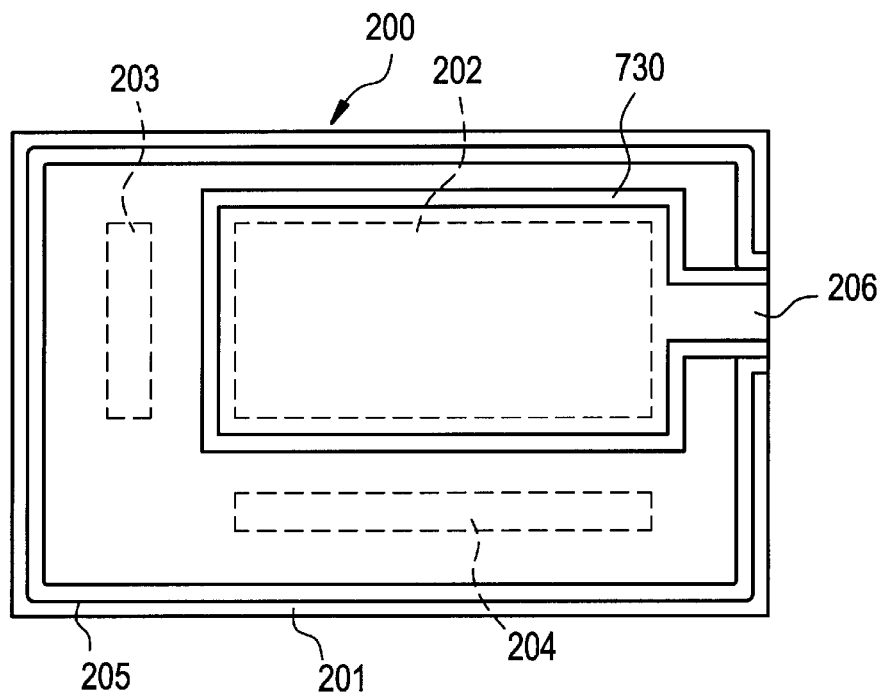
FIGS. 25A and 25B are a top view and an enlarged perspective view, respectively, of an opposed substrate according to a sixteenth embodiment of the invention.
Figure 25B:
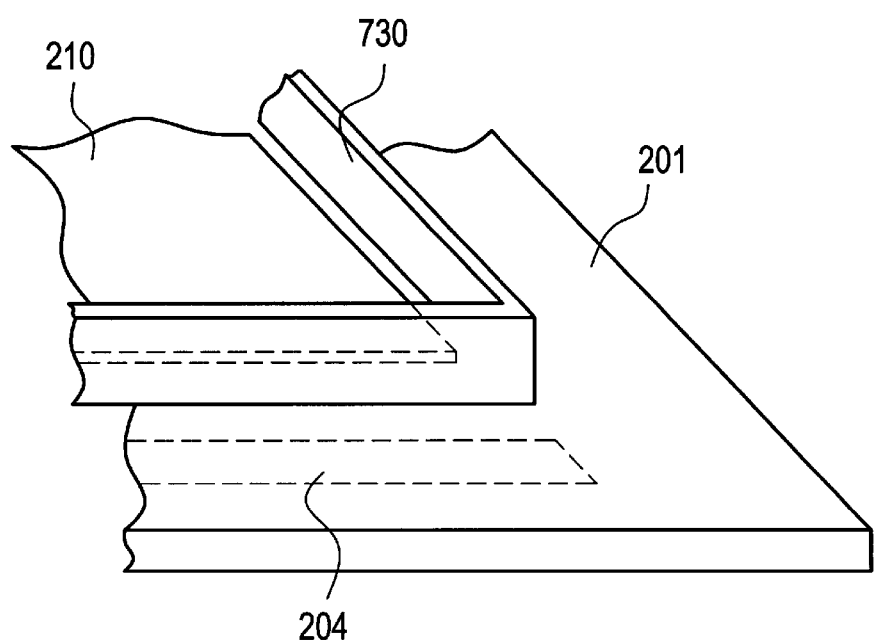

This embodiment is a modification of the fifteenth embodiment. FIGS. 25A and 25B are a top view and an enlarged perspective view, respectively, of an opposed substrate according to this embodiment. The manufacturing method of the opposed substrate is the same as in the tenth embodiment, and members in FIGS. 25A and 25B that are given the same reference numerals as in FIGS. 21A and 21B are the same as the corresponding members in FIGS. 21A and 21B.

In this embodiment, a gap retaining member 730 is approximately shaped like a wall that erects from the substrate 201. The gap retaining member 730 surrounds a pixel-confronting area 202 and is connected to the liquid crystal injection inlet 206. The gap retaining member 730 is 20 μm in width and 3.2 μm in height and is separated from the end of the pixel-confronting area 202 by 50 μm.

In this embodiment, the gap retaining member 730 is formed in an area that does not overlap with any of the pixel area 102 and the driver circuit areas 103 and 104 when the substrates 100 and 200 are bonded together. Since the cell gap is determined by only the height of the gap retaining member 730, the cell gap can be made uniform over the entire substrate or among different substrates even if there is a height difference between the pixel area 102 and the driver circuit areas 103 and 104.

Since the gap retaining member 730 does not press the TFTs formed in the TFT substrate 100, the yield can be increased.

Figure 26:
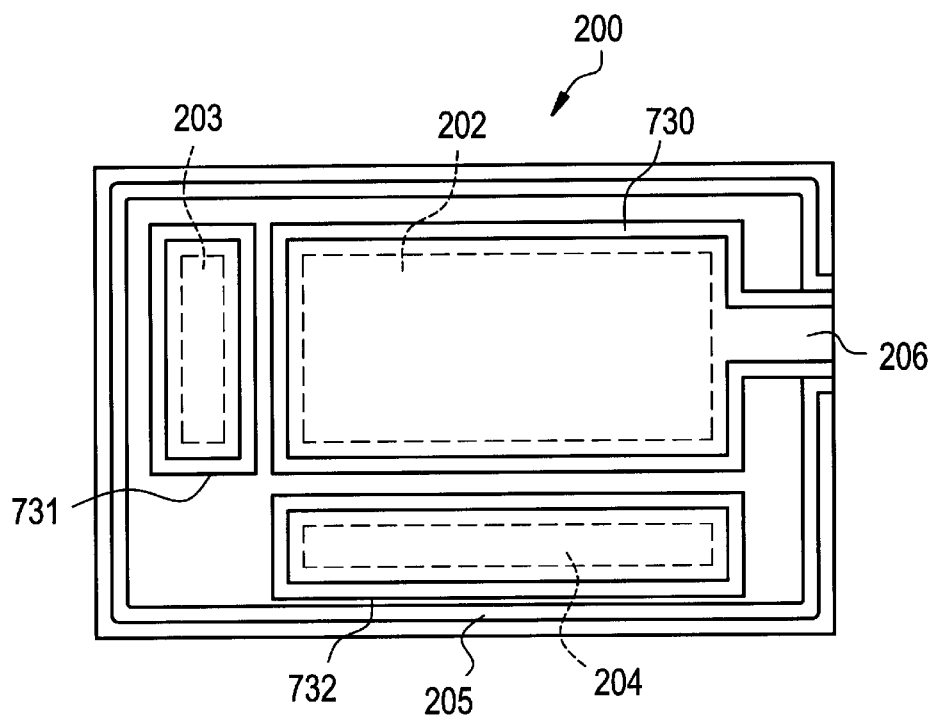
FIG. 26 is a top view of another opposed substrate according to the sixteenth embodiment.

Further, as shown in FIG. 26, this embodiment has a feature that the gap retaining member 730 has a structure that enables sealing of a liquid crystal in the pixel area 102. Because of the presence of the gap retaining member 730, a liquid crystal is injected into only the space corresponding to the pixel area 102 and is not injected into the spaces corresponding to the driver circuit areas 103 and 104. Therefore, the load capacitances of the driver circuits can be reduced and hence crosstalk can be made less prone to occur.

While in FIG. 25A the gap retaining member 730 is formed only around the pixel-confronting area 202, as shown in FIG. 26 wall-shaped gap retaining members 731 and 732 similar to the gap retaining member 730 may additionally be formed around the driver-circuit-confronting areas 203 and 204.

In this embodiment, it is sufficient that the gap retaining member 730 has a structure that enables sealing of a liquid crystal in the pixel area 102, and hence the shape of the gap retaining members 731 and 732 is not limited to the wall-like shape and may be a cylindrical shape, an elliptical pole shape, a rectangular prism shape, or a polygonal prism shape. The positions of the gap retaining members 731 and 732 are not limited to the neighborhood of the driver-circuit-confronting areas 203 and 204; they may be formed anywhere except the pixel-confronting area 202 and the peripheral-circuit-confronting areas 203 and 204 as long as they can retain the cell gap.

Embodiment 17

Figure 27:
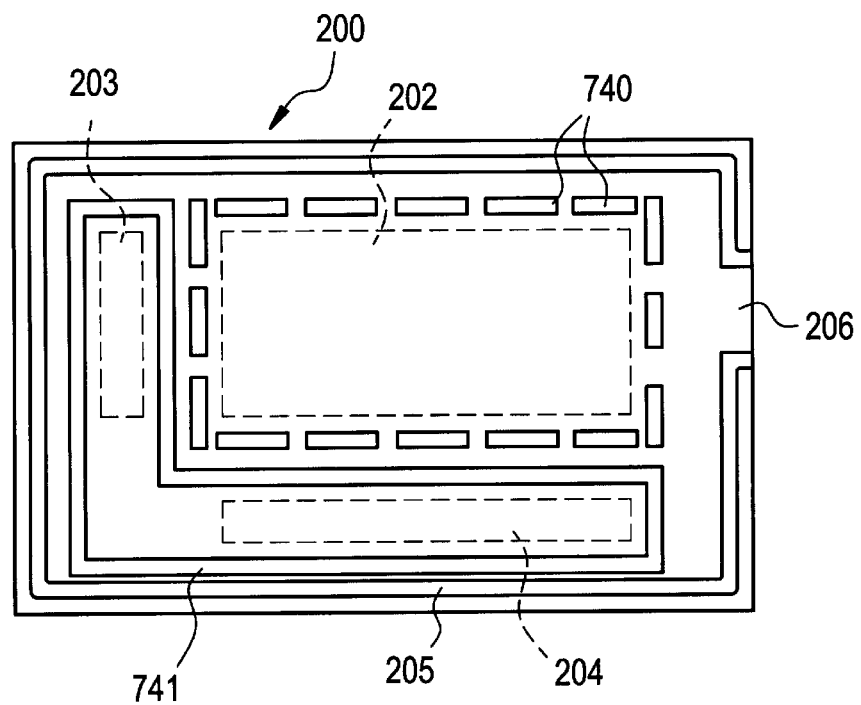
FIG. 27 is a top view of an opposed substrate according to a seventeenth embodiment of the invention.

This embodiment is a modification of the sixteenth embodiment. This embodiment has a feature that gap retaining members are configured so that a liquid crystal is injected into the space corresponding to the pixel area 102 but is not injected into the spaces corresponding to the driver circuit areas 103 and 104. FIG. 27 is a top view of an opposed substrate according to this embodiment. The manufacturing method of the opposed substrate is the same as in the tenth embodiment, and members in FIG. 27 that are given the same reference numerals as in FIGS. 21A and 21B are the same as the corresponding members in FIGS. 21A and 21B.

In this embodiment, as shown in FIG. 27, the driver-circuit-confronting areas 203 and 204 are surrounded by a wall-shaped gap retaining member 741 so that a liquid crystal 300 does not enter the driver circuit areas 103 and 104 in the state that the substrates 100 and 200 are bonded together.

In this embodiment, as shown in FIG. 27, the gap retaining member 714 is approximately shaped like a wall that erects from the substrate 201. The gap retaining member 714 is 20 μm in width and 3.2 μm in height and is separated from the end of the driver-circuit-confronting areas 203 and 204 by 50 μM.

In this embodiment, rectangular-prism-like gap retaining member 740 are arranged so as to surround the pixel-confronting area 202 so that a liquid crystal can flow into the pixel area 102. Each gap retaining member 740 is shaped like a rectangular prism in which the long side length is 30 µm, the short side length is 15 µm, and the height is 3.2 µm. The gap retaining members 740 are separated from the end of the pixel-confronting area 202 by 70 µm, and the interval between adjacent ones of the gap retaining members 740 is set at 30 µm. The arrangement density of part of the gap retaining members 740 in the vicinity of the liquid crystal injection inlet 206 is made lower than in the other portions to facilitate injection of a liquid crystal.

Although the tenth to seventeenth embodiments are directed to the case where a liquid crystal material is used as a display medium, the invention can also be applied to a case of using a mixed layer of a liquid crystal and a polymer, that is, the invention can also be applied to a polymer dispersion type liquid crystal display device.

Embodiment 18

Figure 28:
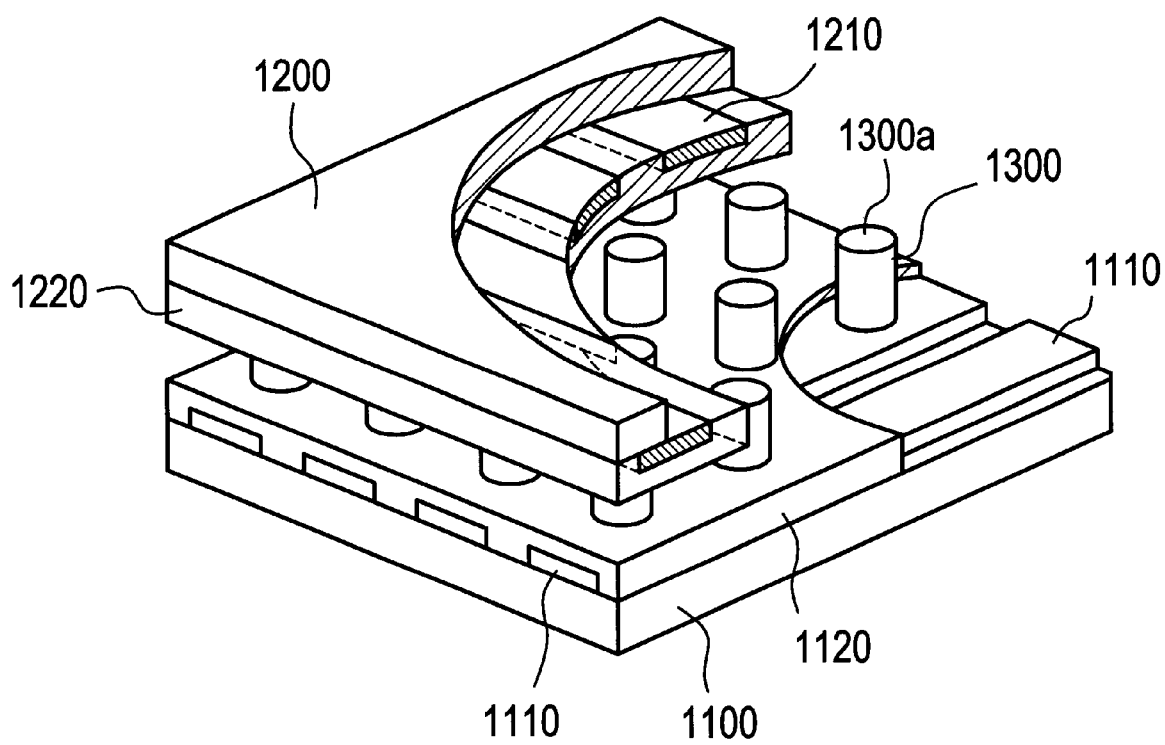
FIG. 28 is a schematic perspective showing the configuration of a passive matrix liquid crystal panel according to an eighteenth embodiment of the invention.

This embodiment is directed to a case where the invention is applied to an STN reflection type liquid crystal panel. FIG. 28 is a schematic perspective view of a liquid crystal panel according to this embodiment. As shown in FIG. 28, striped reflective electrodes 1110, an alignment film 1120, and gap retaining members 1300 are provided on a glass substrate 1000. To retain the cell gap, the gap retaining members 1300 are arranged uniformly over the entire substrate 1000. On the other hand, transparent electrodes 1210 and an alignment film 1220 are provided on a glass substrate 1200. The glass substrates 1000 and 1200 are opposed to each other with the alignment films 1120 and 1220 located inside. The interval between the glass substrates 1000 and 1200 is secured by the gap retaining members 1300, and an STN liquid crystal is sealed in the space between the substrates 1000 and 1200.

A manufacturing method of the reflection-type liquid crystal panel according to this embodiment will be described with reference to FIGS. 29A–29F to 31. First, to form reflective electrodes 1110, a metal film is formed on a glass substrate 1000. In this embodiment, a 400-nm-thick aluminum film is formed by sputtering and then patterned into striped reflective electrodes 1110 (see FIG. 29A). The reflective electrodes 1110 extend in the direction perpendicular to the paper surface of FIGS. 29A–29F.

Then, to form gap retaining members 1130, a coating 910 is formed by using an insulative material. In this embodiment, a 3.5-µm-thick photosensitive polyimide film 910 is formed by spin coating and then left at the room temperature for 30 minutes (leveling) to uniformize the thickness of the photosensitive polyimide film 910 over the TFT substrate. Thereafter, the glass substrate 1000 on which the photosensitive polyimide film 910 is formed is pre-baked at 120° C. for 3 minutes (see FIG. 29B).

Then, the top surface of the photosensitive polyimide film 910 is planarized by chemical mechanical polishing (CMP). In this embodiment, slurry that is used in the CMP step is a colloid-like one in which a silica ($SiO_2$) fine powder is dispersed in an acid solution. As for the CMP conditions, each of the substrate and an abrasive cloth is rotated at 50 rpm and the polishing time is set at 3 minutes. In this CMP step, the top 1-µm layer of the photosensitive polyimide film 910 is removed by polishing, whereby a polished photosensitive polyimide film 920 has a height of 2.6 µm as measured from the surfaces of the reflective electrodes 1110.

Although in this embodiment the slurry that is used in the CMP step is one in which a silica fine powder is dispersed in an acid solution, slurry obtained by dispersing aluminum oxide ($Al_2O_3$), cerium oxide ($CeO_2$), or the like in an acid solution may also be used. It is desirable that the slurry be changed in accordance with the material that is subjected to CMP. Further, the optimum rotation speed of each of the substrate and an abrasive cloth and processing time may be determined in accordance with a material to be subjected to CMP and the polishing removal thickness.

The cell gap (interval between the substrates) is determined by the thickness of the photosensitive polyimide film 920 that has been obtained by CMP. Therefore, the thickness of the photosensitive polyimide film 910 before being subjected to CMP may be set properly in accordance with the desired cell gap and the polishing removal thickness.

Even if the thickness of the photosensitive polyimide film 910 before being subjected to CMP varies from one substrate to another, the thickness of the photosensitive polyimide film 920 can be made uniform among different substrates by adjusting the polishing removal thickness.

Figure 29A:
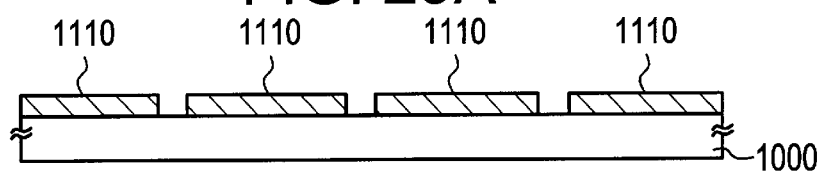
FIGS. 29A–29F and 30A–30B show a manufacturing process of the passive matrix liquid crystal panel according to the eighteenth embodiment.
Figure 29B:
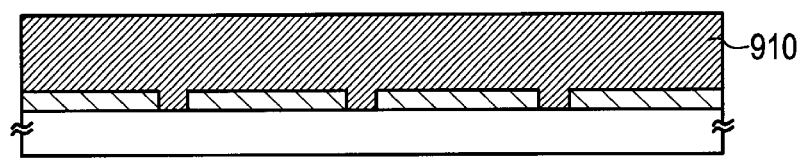
Figure 29C:
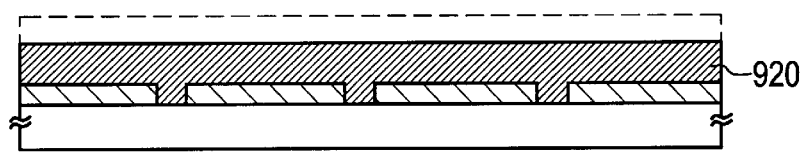
Figure 29D:
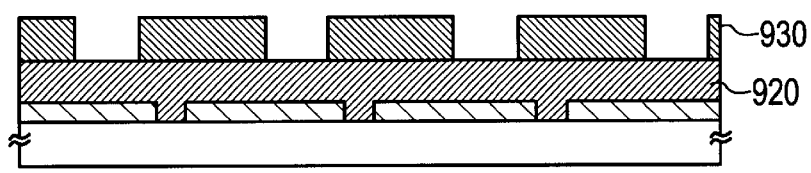

Then, to pattern the photosensitive polyimide film 920 that has been obtained by CMP, the photosensitive polyimide film 920 is covered with a photomask 930 as shown in FIG. 29D. Although in FIG. 29D the photomask 930 is drawn as if it were divided, actually it is an integral layer having circular openings.

Figure 29E:
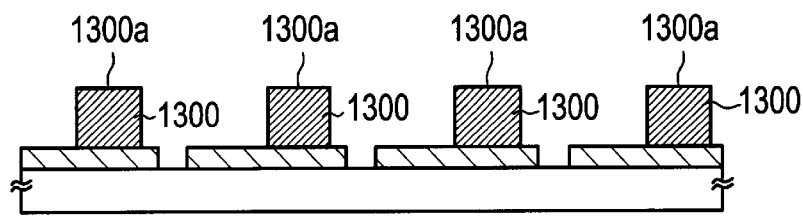

Ultraviolet light is applied in the state of FIG. 29D. Subsequently, development is performed and then post-baking is performed at 280° C. for one hour. In this manner, as shown in FIG. 29E, portions of the photosensitive polyimide film 920 that have been illuminated with ultraviolet light remain and cylindrical gap retaining members 1300 are formed.

Then, a polyimide-type vertical alignment film 1120 is formed on the substrate 1000 by one of spin coating, flexography, and screen printing. In this embodiment, to reduce physical impact on the gap retaining members 1300, the alignment film 1120 is formed by spin coating. Thereafter, the polyimide film 1120 is cured by baking it by feeding a hot wind of 180° C. Settings are made so that after the curing the alignment film has a thickness of 100 nm (see FIG. 29F).

Figure 29F:
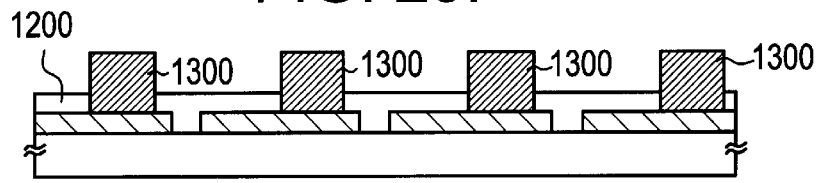
Figure 32:
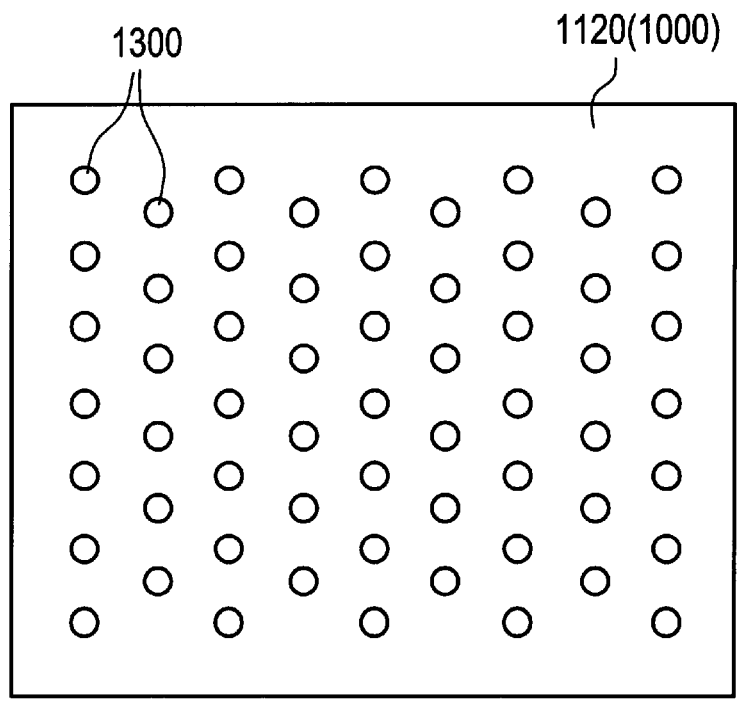
FIG. 32 is a top view of a substrate showing an arrangement of gap retaining members according to the eighteenth embodiment.

FIG. 32 is a top view of the substrate 100 in the state of FIG. 29F. In this embodiment, the gap retaining members 1300 are shaped like a cylinder with a circular cross-section in which the bottom face diameter is 3 µm and the height as measured from the surface of the alignment film 1120 is about 2.5 µm. The gap retaining members 1300 are arranged regularly at a density of 50 $mm^{-2}$. The arrangement density of the gap retaining members 1300 may be set at 40–160 $mm^{-2}$, which is approximately equal to the dispersion density of conventional spacers, in accordance with the strength of the gap retaining members 1300.

In this embodiment, the gap retaining members 1300 are formed at positions on the reflective electrodes 1110 where the top faces 1300a of the respective gap retaining members 1300 confront the transparent electrodes 1210 in the state that the glass substrates 1000 and 1200 are opposed to each other.

The surface (to contact a liquid crystal material) of each glass substrate 1000 or 1200 has periodic asperities due to the multilayered structure including the striped electrodes 1110 or 1210. In the state that the glass substrates 1000 and 1200 are opposed to each other, the cell gap varies periodically due to those asperities. In view of this, in this embodiment, all the gap retaining members 1300 are formed at positions having almost the same cell gap value and the heights of the respective gap retaining members 1300 are approximately equalized by CMP. In this manner, the cell gap is made uniform over the entire substrate.

In FIG. 29F, the alignment film 1120 is drawn so as not to cover the side faces and the top faces 1300a of the gap retaining members 1300. This is because in this embodiment the alignment film 1120 may not assume a complete film on the side faces and the top faces 1300a of the gap retaining members 1300 that are erected as shown in FIG. 29F, because the polyimide film is formed by spin coating and the polyimide film (thickness: tens to hundreds of nanometers) is much thinner than the gap retaining members 1300 (height: several micrometers). Thus, FIG. 29F shows only the alignment film 1120 that is formed on the horizontal surface and assumes a complete film.

Figure 30A:
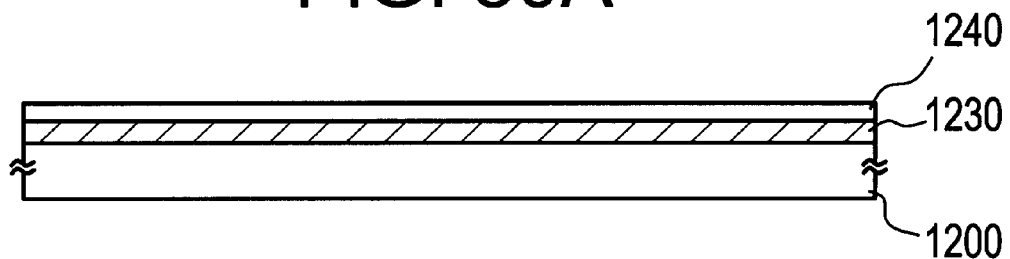
Figure 30B:
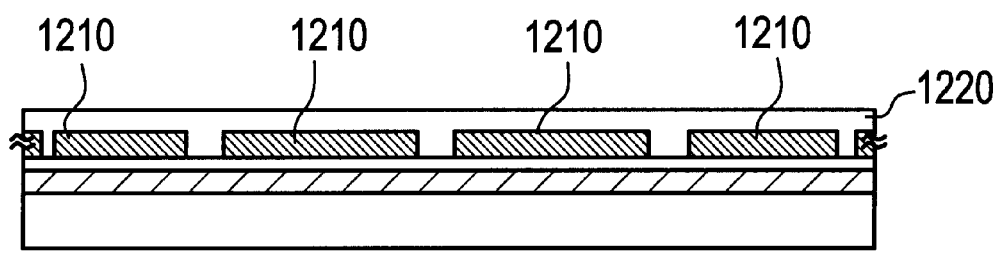

Next, a process to be executed on the glass substrate 1200 will be described with reference to FIGS. 30A and 30B. Color filters 1230 are formed on the glass substrate 1200, and then a protective film 1240 made of an acrylic resin or an epoxy resin is formed on the color filters 1230. In this embodiment, a 1-$\mu$m-thick acrylic resin is formed as the protective film 1240 (see FIG. 30A). In FIG. 28, the color filters 1230 and the protective film 1240 are omitted.

Then, transparent conductive films of ITO (indium tin oxide), $SnO_2$ (tin oxide), or the like are formed as transparent electrodes 1210. In this embodiment, an ITO film is formed by sputtering and then patterned into striped transparent electrodes 1210. Thereafter, a polyimide-type vertical alignment film 1220 is formed by the same method as the alignment film 1120 is formed (see FIG. 30B).

Then, rubbing is performed on each of the alignment films 1120 and 1220. In this embodiment, each of the alignment films 1120 and 1220 is rubbed with a roller on which a buff cloth (fiber of rayon or nylon) having hair lengths of 2–3 mm is wound. The rubbing direction is set parallel with one of the diagonals of the glass substrate 1000 or 1200. The directions of rubbing on the alignment films 1120 and 1220 are set so as to be perpendicular to each other in the state that the glass substrates 1000 and 1200 are opposed to each other.

As for the glass substrate 1000, the gap retaining members 1300 project from the alignment film 1120. Therefore, there is a possibility that the gap retaining members 1300 are damaged or peeled. This problem can be avoided by properly adjusting the kind and the hair planting density of a buff cloth, the rotation speed of the roller, the number of rubbing operations, and other factors.

Then, a sealing agent for bonding the glass substrates 1000 and 1200 together is applied to one of the glass substrates 1000 and 1200. In this embodiment, a sealing agent made of an ultraviolet curable resin is applied to a peripheral portion of the glass substrate 1200 so as to leave a liquid crystal injection inlet. Thereafter, the glass substrates 1000 and 1200 are opposed to each other and pressed against each other so that the cell gap becomes equal to the height of the gap retaining members 1300. The sealing agent is cured in this state by illuminating it with ultraviolet light.

Then, a liquid crystal is injected through the liquid crystal injection inlet. Subsequently, a sealing agent is applied to the liquid crystal injection inlet and then cured by illuminating it with ultraviolet light. The liquid crystal is thus completely sealed in the cell. Then, a phase plate 1510, a polarizer 1520, and a forward scattering plate 1530 are provided on the back surface of the glass substrate 1200. As a result of the execution of the above steps, a full-color STN liquid crystal panel shown in FIG. 31 is completed.

Figure 31:
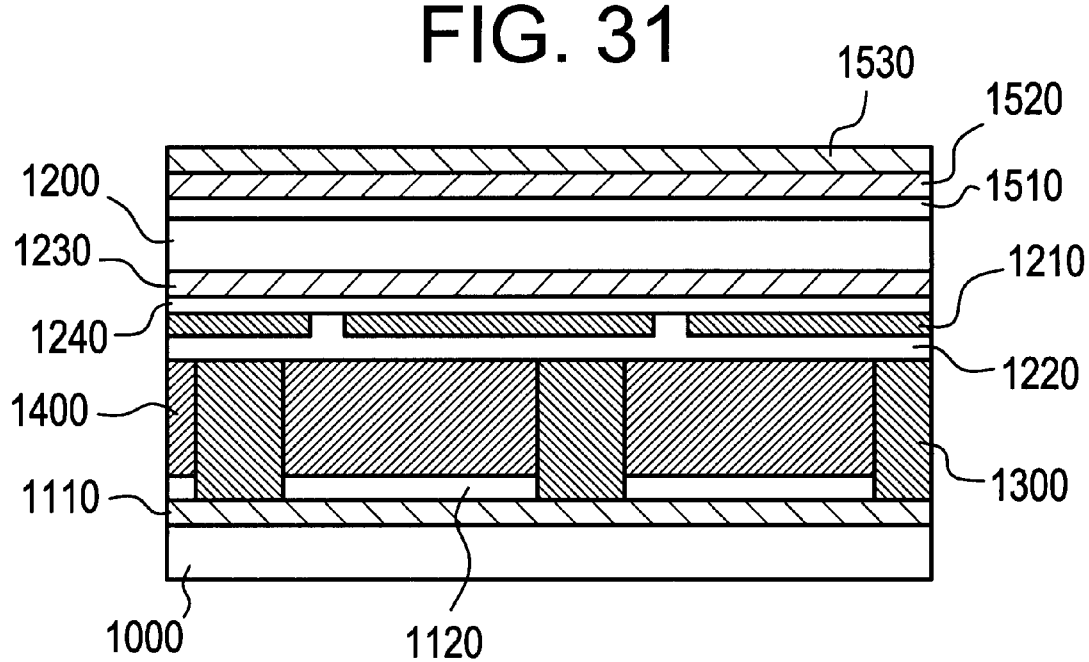
FIG. 31 is a schematic sectional view of the passive matrix liquid crystal panel according to the eighteenth embodiment.

FIG. 31 is a sectional view of the liquid crystal panel. In FIG. 31, the striped reflective electrodes 1110 extend in the direction parallel with the paper surface and the striped transparent electrodes 1210 extend in the direction perpendicular to the paper surface.

In this embodiment, the reason why the gap retaining members 1300 are provided on the glass substrate 1000 side is that the color filters 1230 are provided on the glass substrate 1200 side. The gap retaining members 1300 are formed through chemical mechanical polishing, which involves application of physical force. In this embodiment, to minimize the rate of occurrence of defective products, the gap retaining members 1300 are provided on the glass substrate 1000 side where the color filters 1230 are not provided.

This embodiment is directed to the full-color panel. On the other hand, the color filters 1230 are not required in black-and-white display panels, three-panel-type projection display panels, etc. In such cases, the gap retaining members 1300 may be provided on either the glass substrate 1000 or 1200. That is, the substrate to be provided with the gap retaining members 1300 may be selected so that the rate of occurrence of defective products is reduced in the manufacturing process.

Although this embodiment is directed to the reflection-type liquid crystal panel, the gap retaining members 1300 of this embodiment can be used in transmission-type panels.

Figure 33:
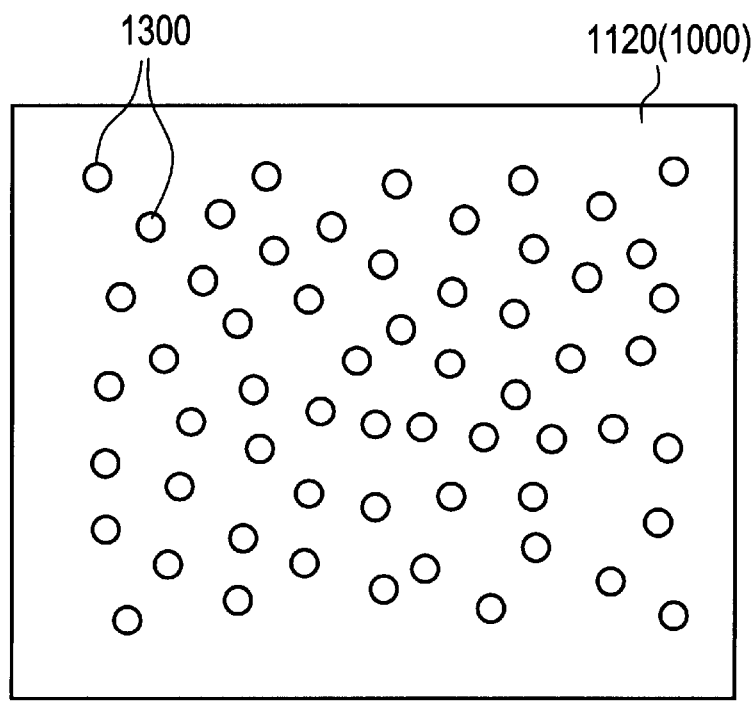
FIG. 33 is a top view of a substrate showing an arrangement of gap retaining members according to a modification of the eighteenth embodiment.
Figure 34A:
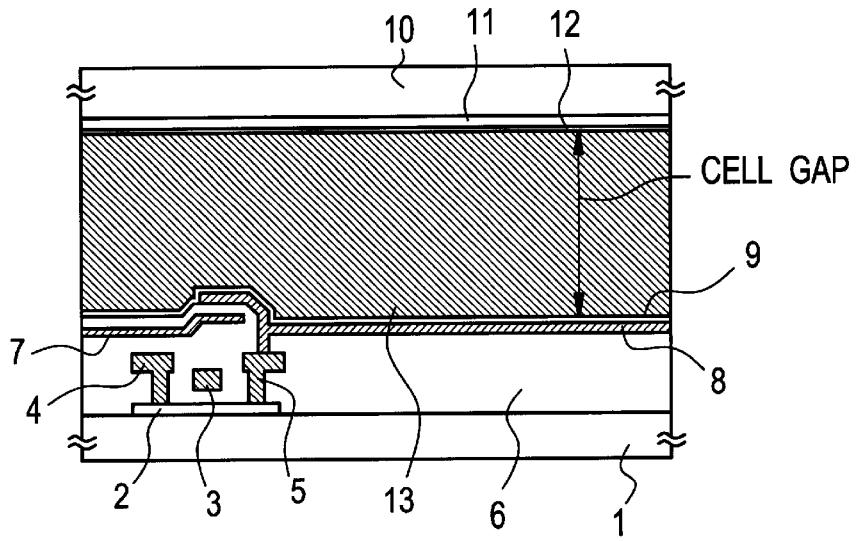
FIGS. 34A and 34B are a sectional view and a plan view, respectively, of a conventional active matrix liquid crystal display device.
Figure 34B:
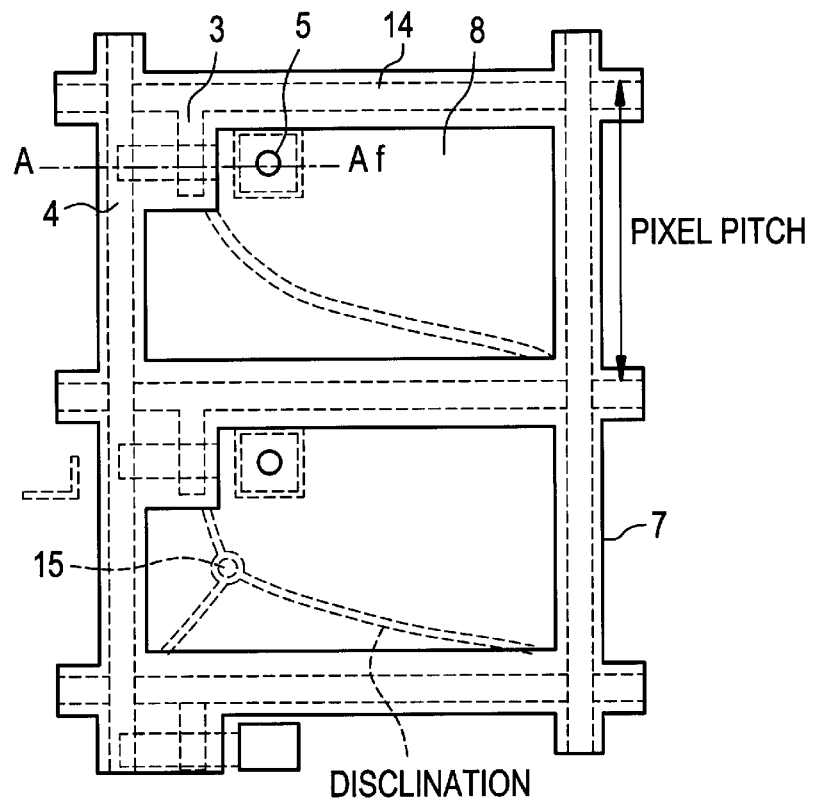
Figure 35A:
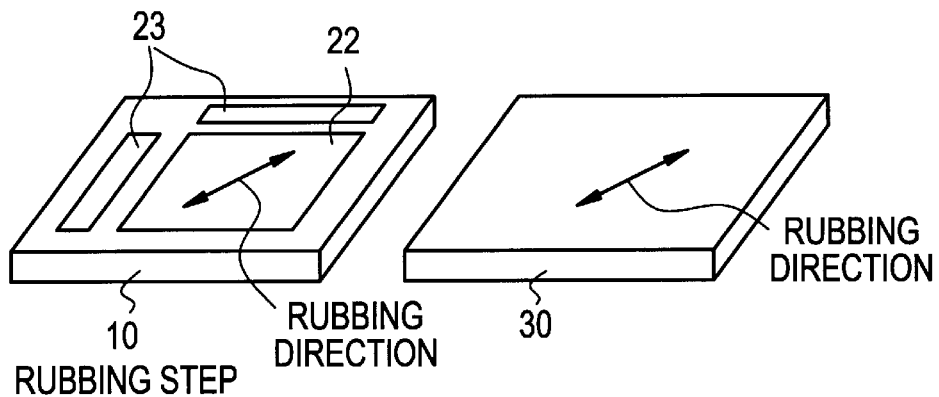
FIGS. 35A and 35B show a manufacturing process of the conventional active matrix liquid crystal display device.
Figure 35B:
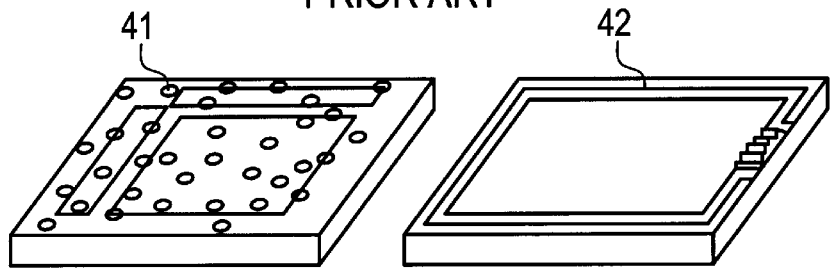
Figure 36:
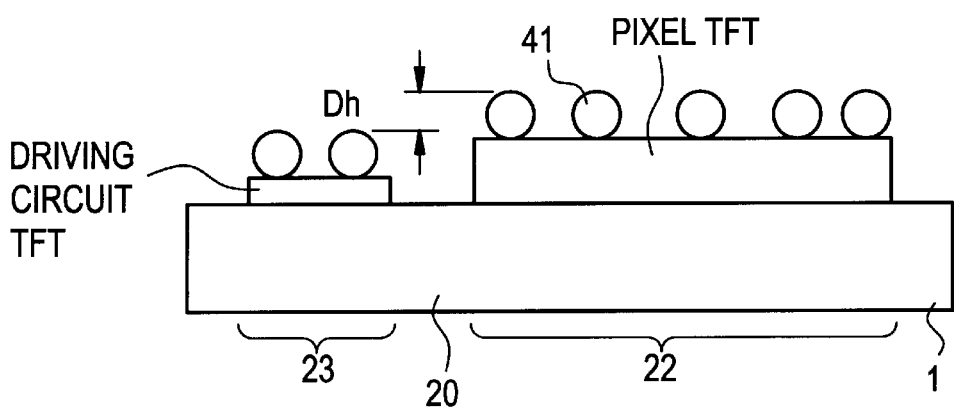
FIG. 36 is a sectional view of a TFT substrate of the conventional active matrix liquid crystal display device.
Figure 37A:
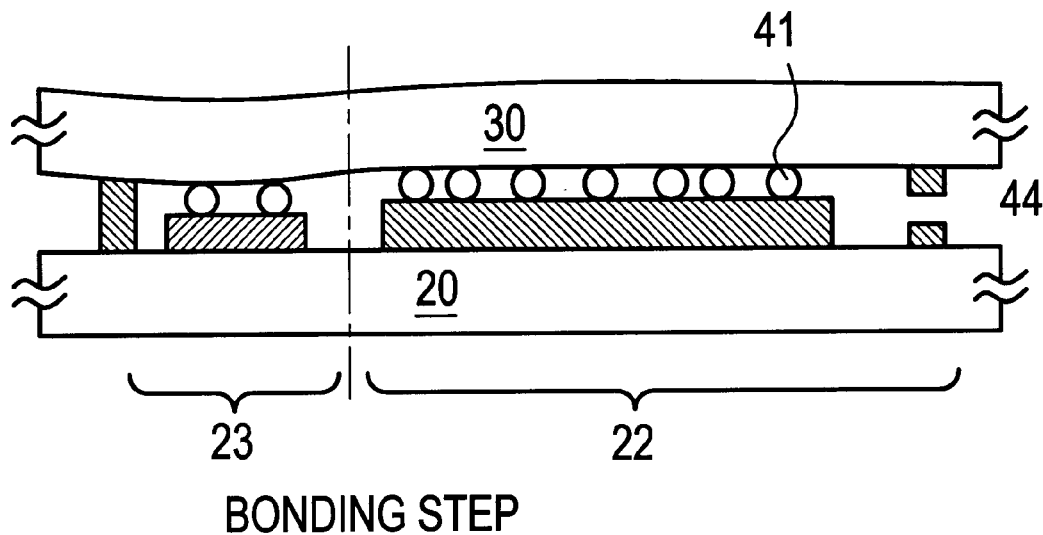
FIGS. 37A and 37B are sectional views of the conventional active matrix liquid crystal display device.
Figure 37B:
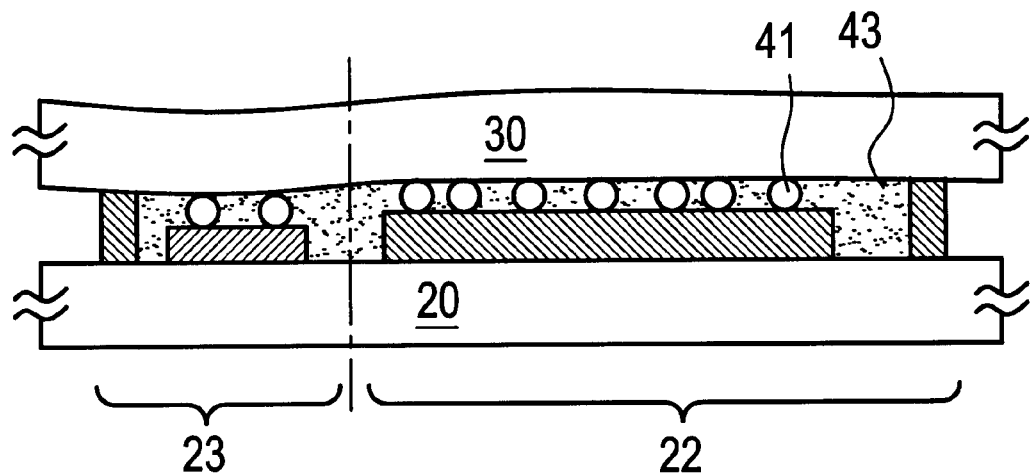

Although in this embodiment the gap retaining members 1300 are arranged regularly, they may be arranged randomly, for example, as shown in FIG. 33. Even in such a case the gap retaining members 1300 are not gathered at a single location unlike the conventional spacers, because their positions are determined by the photomask 930.

Although in this embodiment the bottom face of each gap retaining member 1300 is a circle, it may be an ellipse or may have a streamlined shape or a polygonal shape such as a triangle or a rectangle. The gap retaining members 1300 may assume any shape as long as they can control the cell gap and provide sufficient strength. Although in this embodiment all the gap retaining members 1300 have the same shape, gap retaining members 1300 having plural kinds of shapes may be formed on the same substrate. In this embodiment, since the shape of the bottom face of each gap retaining member 1300 is determined by the photomask 930, it can be changed easily with high accuracy.

Although in this embodiment the arrangement density of the gap retaining members 1300 is set uniform, it may be increased in a particular region, for instance, to increase the strength there. In this embodiment, since the arrangement density of each gap retaining member is determined by the photomask 930, it can be changed easily with high accuracy.

Embodiment 19

While the eighteenth embodiment is directed to the STN liquid crystal panel, the invention can be applied to a liquid crystal panel using a ferroelectric liquid crystal. In this embodiment, in the reflection-type panel shown in FIG. 28, the gap retaining members 1300 are formed so as to assume a cylinder in which the height as measured from the reflective electrodes 1110 is 1.5 $\mu$m and the bottom face is a circle of 2 $\mu$m in diameter. The manufacturing method, the positions of formation, and the arrangement density of the gap retaining members 1300 are the same as in the eighteenth embodiment.

The cell gap can be determined as desired by the gap retaining members 1300 and their positions of formation can be controlled. Further, the faces confronting the other substrate is made flat. Therefore, by virtue of the use of the gap retaining members 1300, the cell gap that is smaller than the spiral pitch of a ferroelectric liquid crystal can be made uniform with high accuracy over the entire substrate.

Ferroelectric liquid crystals have features that no crosstalk occurs, the viewing angle is wide, and the switching speed is three orders or more higher than that of STN liquid crystals, and hence can realize high-resolution, large-screen displays even with the passive matrix driving scheme. Therefore, the use of the gap retaining members 1300 of this embodiment makes it possible to provide, at a low cost, a high-resolution, large-screen ferroelectric liquid crystal panel.

Further, an antiferroelectric liquid crystal can be used instead of a ferroelectric liquid crystal. Also in the case of using an antiferroelectric liquid crystal, the cell gap needs to be made less than 2 μm so that the spiral structure of the liquid crystal disappear. By using the gap retaining members 1300 of this embodiment, the cell gap can be made less than 1.5 μm.

As described above, according to the invention, a semiconductor display device having a uniform cell thickness profile can be obtained. Further, according to the invention, since a desired cell gap can be secured without scattering grainy spacers, there can be prevented an event that unnecessary force is exerted on the driver circuit TFTs in bonding the substrates together, which leads to an increase in the yield of products.

According to another aspect of the invention, the accuracy of the cell gap can be made high because the top faces of the gap retaining members are planarized and the planarization is performed by chemical mechanical polishing. This makes it possible to provide an electro-optical device having a uniform cell thickness profile. Further, according to this aspect of the invention, since a desired cell gap can be secured without scattering grainy spacers, there can be prevented an event that unnecessary force is exerted on the driver circuit TFTs in bonding the substrates together, which leads to an increase in the yield of products.

According to a further aspect of the invention, since the gap retaining members are provided on the opposed substrate, influences (etchant-related influences, mechanical impact, etc.) of the formation of the gap retaining members do not affect the elements formed in the TFT substrate, which leads to an increase in yield.

Further, providing the gap retaining members on the opposed substrate makes it easier to select a material of the gap retaining members than providing those on the TFT substrates in which the switching elements such as TFTs are provided. Further, by providing the gap retaining members on the opposed substrate, materials such as an etchant and means that are necessary to form the gap retaining members can be selected from wider ranges.

What is claimed is:

1. A method of manufacturing an electro-optical device, said method comprising the steps of:

forming a plurality of thin-film transistors over a first substrate;

forming an insulating film on one of the first substrate and a second substrate;

performing chemical mechanical polishing on a surface of the insulating film; and forming a plurality of gap retaining members from the polished insulating film.

2. A method of manufacturing a passive matrix driving type electro-optical device having two substrates confronting each other, said method comprising the steps of:

forming an electrode on each of the two substrates;

forming an insulating film on the electrode that is formed on at least one of the two substrates;

performing chemical mechanical polishing on a surface of the insulating film; and patterning the polished insulating film into a gap retaining member for retaining an interval between the two substrates.

3. A method according to claim 2 wherein the insulating film is made of one resin material selected from the group consisting of polyimide, acrylic, polyamide, and polyimideamide.

4. A method according to claim 2 wherein the gap retaining member is made of one of an ultraviolet curable resin and a thermosetting resin.

5. A method according to any one of claims 2 to 4 wherein the gap retaining member is shaped like a pole.

6. A method of manufacturing a display device comprising the steps of:

preparing a first substrate provided with pixel electrodes, transistors for switching said pixel electrodes, and driver circuits for driving said transistors over said first substrate;

forming a film over said first substrate;

leveling a surface of said film by chemical mechanical polishing;

patterning said film into a plurality of gap retaining members; and mating a second substrate opposed to said first substrate with said gap retaining members interposed therebetween.

7. The method according to claim 6, wherein said film comprises a photo curable resin.

8. The method according to claim 6, wherein said display device is a liquid crystal display device.

9. The method according to claim 6, wherein said display device is an electroluminescence display device.

10. The method according to claim 6, wherein said gap retaining members comprise a material selected from the group consisting of polyimide, acrylic, polyamide and polyimideamide.

11. A method of manufacturing a display device comprising the steps of:

preparing a first substrate provided with pixel electrodes, transistors for switching said pixel electrodes, and a driver circuit for driving said transistors;

forming a film over said first substrate;

leveling a surface of said film by etching back;

patterning said film into a plurality of gap retaining members; and mating a second substrate opposed to said first substrate with said gap retaining members interposed therebetween.

12. The method according to claim 11, wherein said film comprises a photo curable resin.

13. The method according to claim 11, wherein said display device is a liquid crystal display device.

14. The method according to claim 11, wherein said display device is an electroluminescence display device.

15. The method according to claim 11, wherein said gap retaining members comprise material selected from the group consisting of polyimide, acrylic, polyamide and polyimideamide.

* * * * *